(12) United States Patent
Shang et al.

(10) Patent No.: US 11,900,883 B2
(45) Date of Patent: Feb. 13, 2024

(54) SHIFT REGISTER UNIT, METHOD FOR DRIVING SHIFT REGISTER UNIT, GATE DRIVING CIRCUIT, AND DISPLAY DEVICE

(71) Applicant: BOE TECHNOLOGY GROUP CO., LTD., Beijing (CN)

(72) Inventors: Guangliang Shang, Beijing (CN); Can Zheng, Beijing (CN); Jiangnan Lu, Beijing (CN); Yuhan Qian, Beijing (CN); Li Wang, Beijing (CN); Libin Liu, Beijing (CN); Shiming Shi, Beijing (CN); Dawei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 190 days.

(21) Appl. No.: 17/630,634

(22) PCT Filed: Mar. 19, 2021

(86) PCT No.: PCT/CN2021/081786
§ 371 (c)(1),
(2) Date: Jan. 27, 2022

(87) PCT Pub. No.: WO2022/193281
PCT Pub. Date: Sep. 22, 2022

(65) Prior Publication Data
US 2023/0360608 A1 Nov. 9, 2023

(51) Int. Cl.
*G11C 19/28* (2006.01)
*G09G 3/3266* (2016.01)

(52) U.S. Cl.
CPC .......... *G09G 3/3266* (2013.01); *G11C 19/28* (2013.01); *G09G 2310/0286* (2013.01)

(58) Field of Classification Search
CPC ............................. G11C 19/28; G09G 3/3266
See application file for complete search history.

(56) References Cited

U.S. PATENT DOCUMENTS 8,976,922 B2 3/2015 Shang
9,754,531 B2 * 9/2017 Ji .......................... G09G 3/3225
(Continued)

FOREIGN PATENT DOCUMENTS

CN 102654969 A 9/2012
CN 106023936 A 10/2016
(Continued)

*Primary Examiner* — Sardis F Azongha
(74) *Attorney, Agent, or Firm* — Dave Law Group LLC; Raj S. Dave

(57) ABSTRACT

A shift register unit, a method for driving a shift register unit, a gate driving circuit, and a display device are provided. The shift register unit includes: a second noise reduction control circuit. The second noise reduction control circuit includes: a first control circuit, configured to transmit a first voltage to a second noise reduction control node; a first coupling circuit, configured to store a level of the second noise reduction control node and adjust the level of the second noise reduction control node; a second coupling circuit, configured to reduce an adjustment magnitude of the first coupling circuit in case of adjusting the level of the second noise reduction control node; a transmission circuit, configured to connect the first noise reduction control node and the second noise reduction control node; and a storage circuit, configured to store the level of the first noise reduction control node.

20 Claims, 8 Drawing Sheets

(56) References Cited

U.S. PATENT DOCUMENTS 10,297,203 B2    5/2019   Li
10,460,652 B2   10/2019   Li
10,692,437 B2    6/2020   Liu
10,714,016 B2    7/2020   Liu
10,811,114 B2   10/2020   Yuan et al.

FOREIGN PATENT DOCUMENTS

| | | |
|---|---|---|
| CN | 106098002 A | 11/2016 |
| CN | 107784977 A | 3/2018 |
| CN | 107993615 A | 5/2018 |
| CN | 108230999 4 | 6/2018 |
| CN | 108231034 A | 6/2018 |
| CN | 110517622 A | 11/2019 |
| CN | 111415624 A | 7/2020 |
| CN | 111445872 A | 7/2020 |
| KR | 1020180039196 A | 4/2018 |
| KR | 1020180072269 A | 6/2018 |

\* cited by examiner

SHIFT REGISTER UNIT, METHOD FOR DRIVING SHIFT REGISTER UNIT, GATE DRIVING CIRCUIT, AND DISPLAY DEVICE

CROSS-REFERENCE TO RELATED APPLICATIONS

The present application is the U.S. National Stage Entry of PCT/CN2021/081786, filed on Mar. 19, 2021, the entire disclosure of which is incorporated herein by reference as part of the disclosure of this application.

TECHNICAL FIELD

Embodiments of the present disclosure relate to a shift register unit, a method for driving a shift register unit, a gate driving circuit, and a display device.

BACKGROUND

Organic light-emitting diode (OLED) display panels have advantages of the thin thickness, light weight, wide viewing angle, active light emitting, continuously adjustable light-emitting color, low cost, fast response speed, low energy consumption, low driving voltage, wide operating temperature range, simple production process, high luminous efficiency, flexible display, etc., and have been more and more widely used in display fields such as mobile phones, tablet computers, digital cameras, etc.

A pixel array of an organic light-emitting diode display panel generally includes a plurality of rows of gate lines and a plurality of columns of data lines, and the plurality of rows of gate lines are crisscrossed with the plurality of columns of data lines. The driving of the gate lines may be realized through a bonded integrated driving circuit. In recent years, with the continuous improvement of the preparation process of amorphous silicon thin film transistors or oxide thin film transistors, the gate driving circuit may also be directly integrated on the thin film transistor array substrate to form a gate driver on array (GOA), so as to drive the gate lines. For example, the GOA including a plurality of cascaded shift register units can be used to provide on-or-off voltage signals (scanning signals) for the plurality of rows of gate lines of the pixel array, so as to control the plurality of rows of gate lines to be turned on in sequence, and simultaneously, data signals are provided to the pixel units in the corresponding row in the pixel array through the data lines, so as to form the grayscale voltage required for each grayscale of the display image in each pixel unit, thereby displaying one frame of image. Current display panels increasingly use GOA technology to drive the gate lines. The GOA technology helps to realize the narrow frame design of the display panel, and can reduce the production cost of the display panel.

SUMMARY

At least one embodiment of the present disclosure provides a shift register unit, which comprises: a first shift register circuit module and a second shift register circuit module. The first shift register circuit module is configured to output a first output signal at a first output terminal according to an input signal received by an input terminal and is configured to provide a turn-on control signal to the second shift register circuit module. The second shift register circuit module comprises an output circuit, a noise reduction circuit, a first noise reduction control circuit, and a second noise reduction control circuit, the output circuit is configured to output a second output signal at a second output terminal in response to the turn-on control signal, the noise reduction circuit is configured to perform noise reduction on the second output terminal under control of a level of a first noise reduction control node, the first noise reduction control circuit is configured to control the level of the first noise reduction control node to turn off the noise reduction circuit in response to the first output signal, and the second noise reduction control circuit is configured to adjust the level of the first noise reduction control node to turn on the noise reduction circuit under control of a first clock signal and a second clock signal. The second noise reduction control circuit comprises a first control circuit, a first coupling circuit, a second coupling circuit, a transmission circuit, and a storage circuit, the first control circuit is configured to transmit a first voltage to a second noise reduction control node under control of the first clock signal, the first coupling circuit is configured to store a level of the second noise reduction control node and adjust the level of the second noise reduction control node under control of the second clock signal, the second coupling circuit is configured to store the level of the second noise reduction control node and reduce an adjustment magnitude of the first coupling circuit in case of adjusting the level of the second noise reduction control node, the transmission circuit is configured to connect the first noise reduction control node and the second noise reduction control node to balance the level of the first noise reduction control node and the level of the second noise reduction control node, and the storage circuit is configured to store the level of the first noise reduction control node.

For example, in the shift register unit provided by some embodiments of the present disclosure, the first control circuit comprises a first transistor, the first coupling circuit comprises a first capacitor, the second coupling circuit comprises a second capacitor, the transmission circuit comprises a second transistor, and the storage circuit comprises a third capacitor; a gate electrode of the first transistor is connected to a first clock signal terminal to receive the first clock signal, a first electrode of the first transistor is connected to a first voltage terminal to receive the first voltage, and a second electrode of the first transistor is connected to the second noise reduction control node; a first electrode of the first capacitor is connected to the second noise reduction control node, and a second electrode of the first capacitor is connected to a second clock signal terminal to receive the second clock signal; a first electrode of the second capacitor is connected to the second noise reduction control node, and a second electrode of the second capacitor is connected to the first voltage terminal; a gate electrode of the second transistor is connected to the second noise reduction control node, a first electrode of the second transistor is connected to the first noise reduction control node, and a second electrode of the second transistor is connected to the second noise reduction control node; and a first electrode of the third capacitor is connected to the first noise reduction control node, and a second electrode of the third capacitor is connected to the first voltage terminal.

For example, in the shift register unit provided by some embodiments of the present disclosure, the second noise reduction control circuit further comprises a second control circuit, and the second control circuit is configured to transmit the second clock signal to the first coupling circuit under control of a level of the second output terminal.

For example, in the shift register unit provided by some embodiments of the present disclosure, the second control circuit comprises a third transistor, and the second electrode of the first capacitor is connected to the second clock signal terminal through the third transistor; and a gate electrode of the third transistor is connected to the second output terminal, a first electrode of the third transistor is connected to the second clock signal terminal, and a second electrode of the third transistor is connected to the second electrode of the first capacitor.

For example, in the shift register unit provided by some embodiments of the present disclosure, the noise reduction circuit is configured to transmit the first voltage to the second output terminal under control of the level of the first noise reduction control node, so as to perform noise reduction on the second output terminal.

For example, in the shift register unit provided by some embodiments of the present disclosure, the noise reduction circuit comprises a fourth transistor, a gate electrode of the fourth transistor is connected to the first noise reduction control node, a first electrode of the fourth transistor is connected to a first voltage terminal to receive the first voltage, and a second electrode of the fourth transistor is connected to the first output terminal.

For example, in the shift register unit provided by some embodiments of the present disclosure, under regulation of the second noise reduction control circuit, a difference between the level of the first noise reduction control node and the first voltage is n times a threshold voltage of the noise reduction circuit, where $1 \leq n \leq 10$.

For example, in the shift register unit provided by some embodiments of the present disclosure, the first noise reduction control circuit is further configured to control the level of the second noise reduction control node in response to the first output signal.

For example, in the shift register unit provided by some embodiments of the present disclosure, the first noise reduction control circuit comprises a fifth transistor and a sixth transistor; a gate electrode of the fifth transistor is connected to the first output terminal to receive the first output signal, a first electrode of the fifth transistor is connected to a first signal terminal to receive a first signal level, and a second electrode of the fifth transistor is connected to the first noise reduction control node; and a gate electrode of the sixth transistor is connected to the first output terminal to receive the first output signal, a first electrode of the sixth transistor is connected to the first signal terminal to receive the first signal level, and a second electrode of the sixth transistor is connected to the second noise reduction control node.

For example, in the shift register unit provided by some embodiments of the present disclosure, the first signal terminal is a second voltage terminal for providing a second voltage, and the first signal level is the second voltage; or the first signal terminal is connected to a first node in the first shift register circuit module, and the first signal level is a level of the first node.

For example, in the shift register unit provided by some embodiments of the present disclosure, the output circuit comprises a seventh transistor, a gate electrode of the seventh transistor is connected to a second signal terminal to receive the turn-on control signal, a first electrode of the seventh transistor is connected to a third clock signal terminal to receive a third clock signal, and a second electrode of the seventh transistor is connected to the second output terminal.

For example, in the shift register unit provided by some embodiments of the present disclosure, the second signal terminal is connected to a second node in the first shift register circuit module.

For example, in the shift register unit provided by some embodiments of the present disclosure, the first shift register circuit module comprises: a first switch transistor, a second switch transistor, a third switch transistor, a fourth switch transistor, a fifth switch transistor, a sixth switch transistor, a seventh switch transistor, an eighth switch transistor, a fourth capacitor, and a fifth capacitor; a gate electrode of the first switch transistor is connected to a fourth clock signal terminal to receive a fourth clock signal, a first electrode of the first switch transistor is connected to a third node, and a second electrode of the first switch transistor is connected to the input terminal; a gate electrode of the second switch transistor is connected to the third node, a first electrode of the second switch transistor is connected to a first node, and a second electrode of the second switch transistor is connected to the fourth clock signal terminal to receive the fourth clock signal; a gate electrode of the third switch transistor is connected to the fourth clock signal terminal to receive the fourth clock signal, a first electrode of the third switch transistor is connected to the first node, and a second electrode of the third switch transistor is connected to a first voltage terminal to receive the first voltage; a gate electrode of the fourth switch transistor is connected to the first node, a first electrode of the fourth switch transistor is connected to a second voltage terminal to receive a second voltage, and a second electrode of the fourth switch transistor is connected to the first output terminal; a first electrode of the fourth capacitor is connected to the first node, and a second electrode of the fourth capacitor is connected to the second voltage terminal; a gate electrode of the fifth switch transistor is connected to a second node, a first electrode of the fifth switch transistor is connected to a fifth clock signal terminal to receive a fifth clock signal, and a second electrode of the fifth switch transistor is connected to the first output terminal; a first electrode of the fifth capacitor is connected to the second node, and a second electrode of the fifth capacitor is connected to the first output terminal; a gate electrode of the sixth switch transistor is connected to the first node, a first electrode of the sixth switch transistor is connected to the second voltage terminal to receive the second voltage, and a second electrode of the sixth switch transistor is connected to a fourth node; a gate electrode of the seventh switch transistor is connected to the fifth clock signal terminal to receive the fifth clock signal, a first electrode of the seventh switch transistor is connected to the third node, and a second electrode of the seventh switch transistor is connected to the fourth node; and a gate electrode of the eighth switch transistor is connected to the first voltage terminal to receive the first voltage, a first electrode of the eighth switch transistor connected to the second node, and a second electrode of the eighth switch transistor is connected to the third node.

For example, in the shift register unit provided by some embodiments of the present disclosure, the first shift register circuit module comprises: an eleventh switch transistor, a twelfth switch transistor, a thirteenth switch transistor, a fourteenth switch transistor, a fifteenth switch transistor, a sixteenth switch transistor, a seventeenth switch transistor, an eighteenth switch transistor, a nineteenth switch transistor, a twentieth switch transistor, a sixth capacitor, and a seventh capacitor; a gate electrode of the eleventh switch transistor is connected to a second clock signal terminal to receive the second clock signal, a second electrode of the eleventh switch transistor is connected to the input terminal to receive the input signal, and a first electrode of the eleventh switch transistor is connected to a third node; a gate electrode of the twelfth switch transistor is connected to the second clock signal terminal to receive the second clock signal, a second electrode of the twelfth switch transistor is connected to the third node, and a first electrode of the twelfth switch transistor is connected to a second node; a gate electrode of the thirteenth switch transistor is connected to the second node, a first electrode of the thirteenth switch transistor is connected to a sixth clock signal terminal to receive a sixth clock signal, and a second electrode of the thirteenth switch transistor is connected to the first output terminal; a first electrode of the seventh capacitor is connected to the second node, and a second electrode of the seventh capacitor is connected to the first output terminal; a gate electrode of the fourteenth switch transistor is connected to a first node, a first electrode of the fourteenth switch transistor is connected to a second voltage terminal to receive a second voltage, and a second electrode of the fourteenth switch transistor is connected to the first output terminal; a first electrode of the sixth capacitor is connected to the first node, and a second electrode of the sixth capacitor is connected to the second voltage terminal; a gate electrode of the fifteenth switch transistor is connected to a first clock signal terminal to receive the first clock signal, a first electrode of the fifteenth switch transistor is connected to the first node, and a second electrode of the fifteenth switch transistor is connected to a first voltage terminal to receive the first voltage; a gate electrode of the sixteenth switch transistor is connected to the first node, a first electrode of the sixteenth switch transistor is connected to the second voltage terminal to receive the second voltage, and a second electrode of the sixteenth switch transistor is connected to a fourth node; a gate electrode of the seventeenth switch transistor is connected to the first node, a first electrode of the seventeenth switch transistor is connected to the fourth node, and a second electrode of the seventeenth switch transistor is connected to the second node; a gate electrode of the eighteenth switch transistor is connected to the second node, a first electrode of the eighteenth switch transistor is connected to the fourth node, and a second electrode of the eighteenth switch transistor is connected to the first voltage terminal to receive the first voltage; a gate electrode of the nineteenth switch transistor is connected to the input terminal receive the input signal, a first electrode of the nineteenth switch transistor is connected to the second voltage terminal to receive the second voltage, and a second electrode of the nineteenth switch transistor is connected to the first node; and a gate electrode of the twentieth switch transistor is connected to the first output terminal to receive the first output signal, a first electrode of the twentieth switch transistor is connected to the sixth clock signal terminal to receive the sixth clock signal, and a second electrode of the twentieth switch transistor is connected to the third node.

At least one embodiment of the present disclosure further provides a gate driving circuit, which comprises a plurality of shift register units, which are cascaded, according to any embodiment of the present disclosure.

For example, in the gate driving circuit provided by some embodiments of the present disclosure, except for a first shift register unit, an input terminal of each of other shift register units is connected to a first output terminal of a previous shift register unit.

At least one embodiment of the present disclosure further provides a display device, which comprises the gate driving circuit according to any embodiment of the present disclosure.

For example, the display device provided by some embodiments of the present disclosure further comprises a plurality of gate lines, and a second output terminal of each shift register unit is connected to at least one gate line of the plurality of gate lines.

At least one embodiment of the present disclosure further provides a method for driving the shift register unit according to any embodiment of the present disclosure, and the method comprises a maintaining phase. In the maintaining phase, the first clock signal and the second clock signal are input alternately, and the level of the first noise reduction control node is adjusted through the second noise reduction control circuit, so as to turn on the noise reduction circuit to allow the noise reduction circuit to perform noise reduction on the second output terminal.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

In order to make objects, technical details and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly. "On," "under," "right," "left," and the like are only used to indicate relative position relationship, and when the position of the object which is described is changed, the relative position relationship may be changed accordingly.

Figure 1:
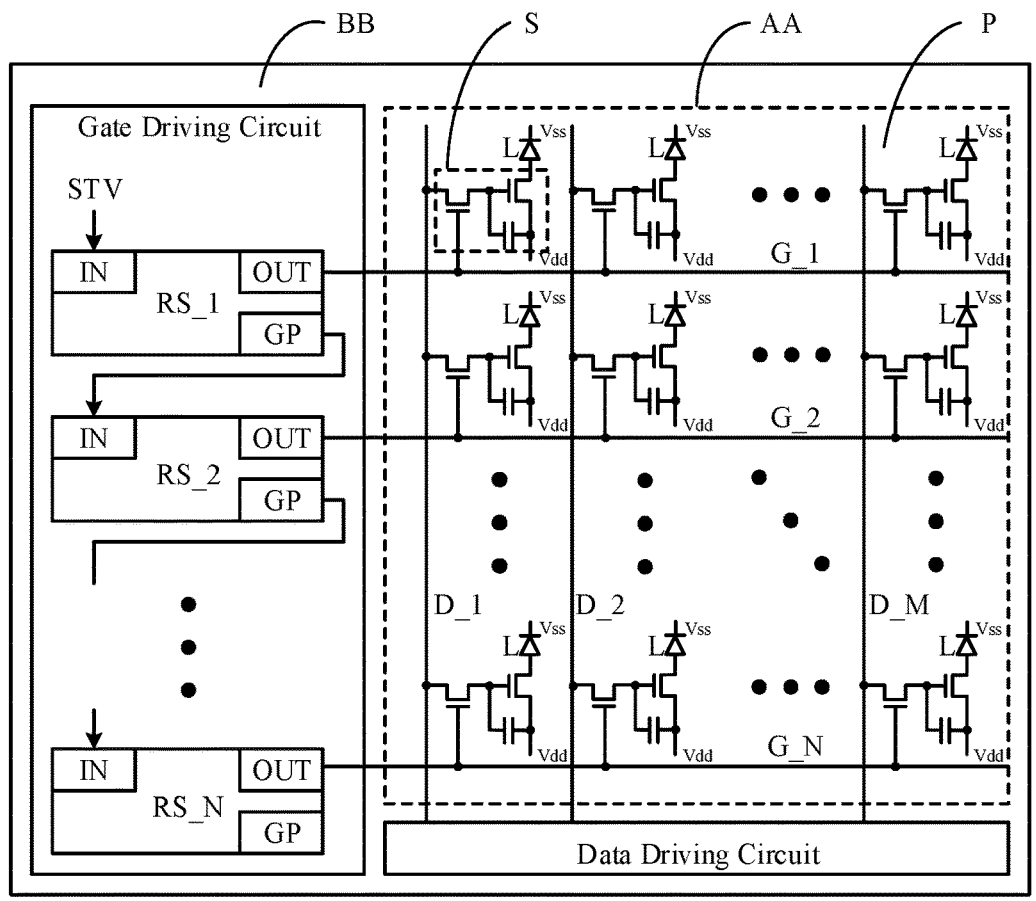
FIG. 1 is a schematic structural diagram of a display panel.

FIG. 1 is a schematic structural diagram of a display panel. As illustrated in FIG. 1, the display panel 01 includes a display region AA and a peripheral region BB located on at least one side of the display region AA. A plurality of sub-pixels P are arranged in an array in the display region AA. For example, the plurality of sub-pixels P usually include sub-pixels of multiple colors, and the sub-pixels of multiple colors usually include a first color sub-pixel, a second color sub-pixel, and a third color sub-pixel. For example, the first color, the second color, and the third color may be three primary colors (e.g., red, green, and blue), but are not limited thereto. For convenience of description, the plurality of sub-pixels P in FIG. 1 are arranged in a matrix form as an example for description. In this case, the sub-pixels P arranged in a row in the horizontal direction are referred to as a row of sub-pixels, and the sub-pixels P arranged in a row in the vertical direction are referred to as a column of sub-pixels.

As illustrated in FIG. 1, each sub-pixel P is provided with a pixel circuit S. The pixel circuit S generally includes a plurality of transistors (illustrated as including two transistors in FIG. 1) and a capacitor. The pixel circuit S is coupled to the light-emitting element L for driving the light-emitting element L to emit light. For example, the light-emitting element L in each color sub-pixel can emit light of the corresponding color, that is, the light-emitting element L in the first color sub-pixel can emit the first color light (e.g., red light), the light-emitting element L in the second color sub-pixel can emit the second color light (e.g., green light), and the light-emitting element L in the third color sub-pixel can emit the third color light (e.g., blue light). The pixel circuits S located in the same row are connected to the same gate line GL (as illustrated by G_1, G_2, . . . , G_N in FIG. 1, where N is a positive integer), and the pixel circuits S located in the same column are connected to the same data line DL (as illustrated by D_1, D_2, . . . , D_M in FIG. 1, where M is a positive integer). The transistors included in the pixel circuit S may be either N-type transistors or P-type transistors, and may also include both N-type and P-type transistors, which can be set according to actual needs. In addition, the transistors included in the pixel circuit S may all be low temperature poly-silicon (LTPS) transistors, may also be oxide transistors, and may also include both LTPS and oxide transistors.

In practical applications, the voltage for controlling the brightness of the sub-pixel may change with time due to the leakage of the transistor in the pixel circuit S. Therefore, in order to keep the brightness fluctuation of the pixel within a reasonable range, it is still necessary to refresh data when displaying a static image. In order to reduce the power consumption when displaying the static image, it is an effective method to reduce the refresh frequency. Meanwhile, in order to maintain the display quality, it is also necessary to reduce the leakage speed of the transistor in the pixel circuit S. Due to the ultra-low leakage characteristics of oxide semiconductors, the transistor in the pixel circuit S can be set as an oxide transistor. At the same time, in order to ensure the charging speed of the sub-pixel and small parasitic capacitance, the advantages of LTPS and oxide transistors can be combined to use low temperature polycrystalline oxide (LTPO) process, so that the pixel circuit S includes two kinds of transistors, i.e., LTPS and oxide transistors. For example, the pixel circuit S may include a P-type LTPS transistor and an N-type oxide transistor.

As illustrated in FIG. 1, the peripheral region BB of the display panel 01 is provided with a gate driving circuit and a data driving circuit. The gate driving circuit can be arranged on a side along the extending direction of the gate line, and the data driving circuit can be arranged on a side along the extending direction of the data line DL, so as to drive the pixel circuit S in the display panel and further to drive the light-emitting element L to emit light to enable the corresponding sub-pixel P to display. For example, the gate driving circuit can be implemented by a bonded integrated circuit driving chip, or the gate driving circuit can also be directly integrated on the display panel to form a GOA. For example, the data driving circuit can be implemented by a bonded integrated circuit driving chip.

It should be noted that FIG. 1 is exemplary. The gate driving circuit is provided on one side of the peripheral region BB of the display panel 01 to sequentially drive each gate line row by row from one side, that is, single-sided driving. For example, the gate driving circuits may also be provided on the two sides along the extending direction of the gate line in the peripheral region BB of the display panel 01, and the two gate driving circuits can simultaneously drive each gate line row by row from two sides, that is, double-sided driving. For example, the gate driving circuits may also be provided on two sides along the extending direction of the gate line in the peripheral region BB of the display panel 01, and the two gate driving circuits can alternately drive each gate line row by row from two sides, that is, cross driving. It should be noted that, in the present disclosure, single-sided driving is taken as an example for description.

As illustrated in FIG. 1, the gate driving circuit includes N cascaded shift register units RS (as illustrated by RS_1, RS_2, . . . , RS_N in FIG. 1), and the N cascaded shift register units are connected to N gate lines (as illustrated by G_1, G_2, . . . , G_N in FIG. 1) in one-to-one correspondence.

As illustrated in FIG. 1, each shift register unit RS includes a signal input terminal IN, a scanning signal output terminal OUT, and a cascaded signal output terminal GP. In the gate driving circuit illustrated in FIG. 1, except for the first shift register unit RS_1, the signal input terminal IN of each of other shift register units is connected to the cascaded signal output terminal GP of the previous shift register unit. The signal input terminal IN of the first shift register unit RS_1 may be configured to receive a trigger signal STV. In addition, each shift register unit RS provides a scanning signal to the gate line connected thereto through the scanning signal output terminal OUT.

It should be understood that the circuit structure of each shift register unit RS in the gate driving circuit illustrated in FIG. 1 may generally be the same. In addition, when the pixel circuit S includes a P-type LTPS transistor and an N-type oxide transistor, the cascaded signal output terminal GP may also be connected to the P-type transistor in the pixel circuit S through, for example, a gate line, so as to transmit a control signal to the P-type transistor to control the P-type transistor to be turned on or turned off.

In the display period of one frame of image, each gate line needs to be driven row by row by the gate driving circuit. In the driving process of each row of gate lines, after the shift register unit outputs the scanning signal, the shift register unit should output a non-operating voltage to the coupled gate line to ensure that the transistor coupled to the gate line is turned off, and this phase is referred to as a maintaining phase. However, in the maintaining phase, the noise at the scanning signal output terminal OUT coupled to the gate line in the shift register unit is relatively large, which may cause the image displayed by the display device to be unstable.

Figure 2:
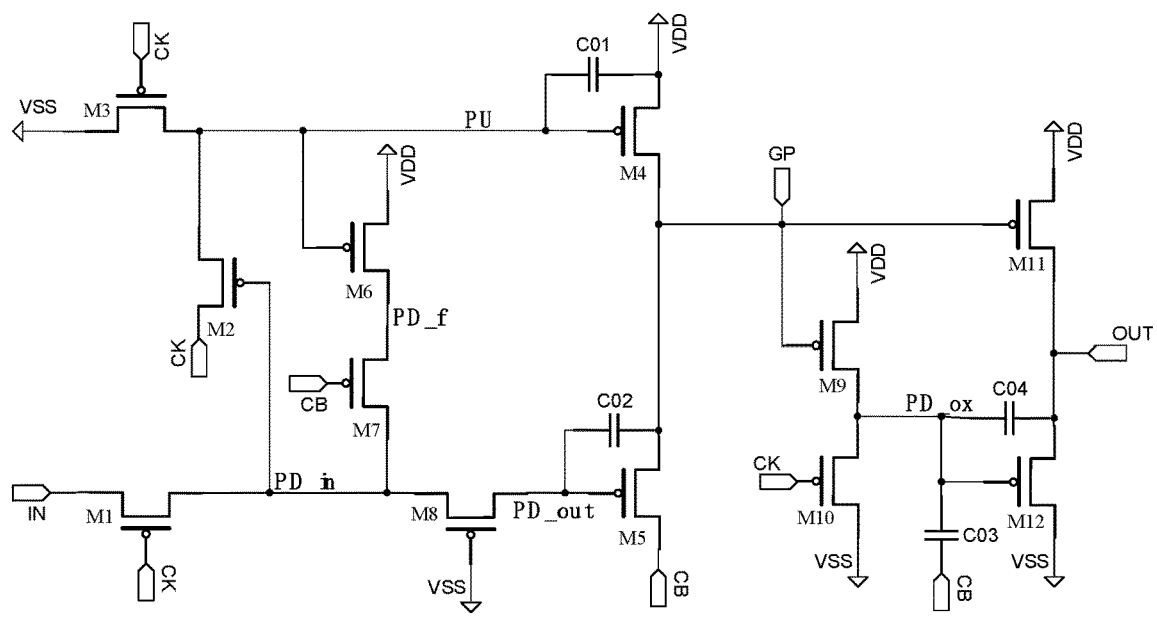
FIG. 2 is a circuit structure diagram of a shift register unit.

FIG. 2 is a circuit structure diagram of a shift register unit. As illustrated in FIG. 2, the shift register unit includes 12 transistors M1~M12 and 4 capacitors (C01~C04). The gate electrode of the transistor M1 is connected to the clock signal terminal CK to receive the clock signal CK, the second electrode of the transistor M1 is connected to the signal input terminal IN, and the first electrode of the transistor M1 is connected to the node PD_in; the gate electrode of the transistor M2 is connected to the node PD_in, the second electrode of the transistor M2 is connected to the clock signal terminal CK to receive the clock signal CK, and the first electrode of the transistor M2 is connected to the node PU; the gate electrode of the transistor M3 is connected to the clock signal terminal CK to receive the clock signal CK, and the second electrode of the transistor M3 is connected to the first power line VSS to receive the first voltage VSS (for example, the first voltage VSS is at a low level), and the first electrode of the transistor M3 is connected to the node PU; the gate electrode of the transistor M4 is connected to the node PU, the first electrode of the transistor M4 is connected to the second power line VDD to receive the second voltage VDD (for example, the second voltage VDD is at a high level), and the second electrode of the transistor M4 is connected to the output terminal GP; the first electrode of the capacitor C01 is connected to the node PU, and the second electrode of the capacitor C01 is connected to the second power line VDD; the gate electrode of the transistor M5 is connected to the node PD_out, the first electrode of the transistor M5 is connected to the clock signal terminal CB to receive the clock signal CB, and the second electrode of the transistor M5 is connected to the cascaded signal output terminal GP; the first electrode of the capacitor C02 is connected to the node PD_out, and the second electrode of the capacitor C02 is connected to the cascaded signal output terminal GP; the gate electrode of the transistor M6 is connected to the node PU, the first electrode of the transistor M6 is connected to the second power line VDD to receive the second voltage VDD, and the second electrode of the transistor M6 is connected to the node PD_f; the gate electrode of the transistor M7 is connected to the clock signal terminal CB to receive the clock signal CB, the first electrode of the transistor M7 is connected to the node PD_in, and the second electrode of the transistor M7 is connected to the node PD_f; the gate electrode of the transistor M8 is connected to the first power line VSS to receive the first voltage VSS, the second electrode of the transistor M8 is connected to the node PD_in, and the first electrode of the transistor M8 is connected to the node PD_out; the gate electrode of the transistor M9 is connected to the cascaded signal output terminal GP, the first electrode of the transistor M9 is connected to the second power line VDD to receive the second voltage VDD, and the second electrode of the transistor M9 is connected to the node PD_ox; the gate electrode of the transistor M10 is connected to the clock signal terminal CK to receive the clock signal CK, the second electrode of the transistor M10 is connected to the first power line VSS to receive the first voltage VSS, and the first electrode of the transistor M10 is connected to the node PD_ox; the gate electrode of the transistor M11 is connected to the cascaded signal output terminal GP, the first electrode of the transistor M11 is connected to the second power line VDD to receive the second voltage VDD, and the second electrode of the transistor M11 is connected to the scanning signal output terminal OUT; the gate electrode of the transistor M12 is connected to the node PD_ox, the second electrode of the transistor M12 is connected to the first power line VSS to receive the first voltage VSS, and the first electrode of the transistor M12 is connected to the scanning signal output terminal OUT; the first electrode of the capacitor C03 is connected to the node PD_ox, and the second electrode of the capacitor C03 is connected to the clock signal terminal CB; and the first electrode of the capacitor C04 is connected to the node PD_ox, and the second electrode of the capacitor C04 is connected to the scanning signal output terminal OUT.

It should be noted that the transistors in the shift register unit illustrated in FIG. 2 are all described by taking P-type transistors as an example, that is, each transistor is turned on when the gate electrode is connected with a low level (that is, the low level is an effective level), and each transistor is turned off when the gate electrode is connected with a high level (that is, the high level is an invalid level). In this case, the first electrode of the transistor may be the source electrode, and the second electrode of the transistor may be the drain electrode.

Figure 3:
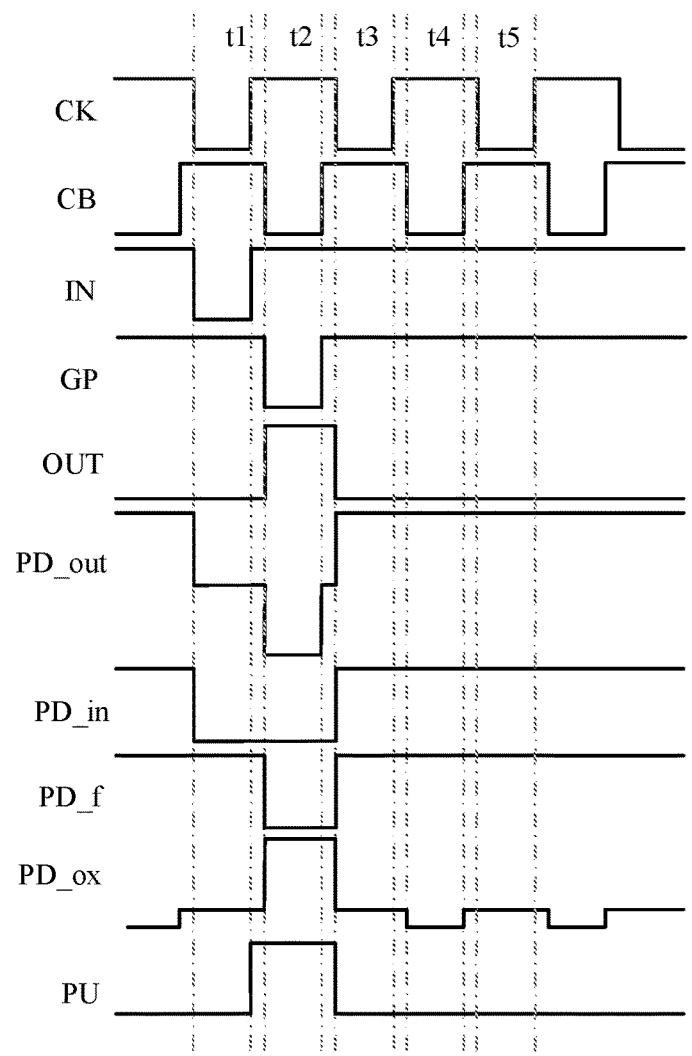
FIG. 3 is a signal timing diagram of the shift register unit illustrated in FIG. 2 in operation.
Figure 4:
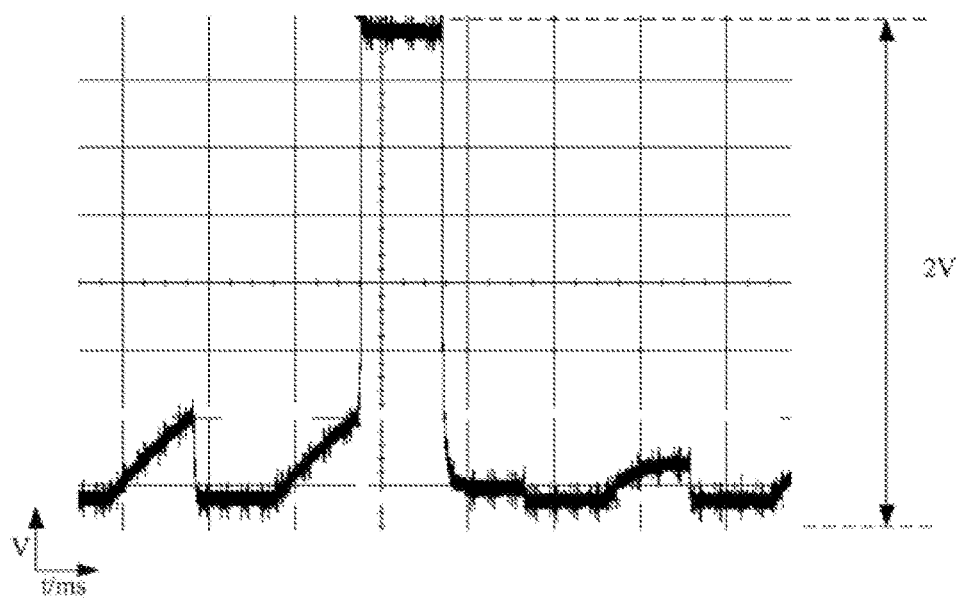
FIG. 4 is an output noise diagram of the shift register unit illustrated in FIG. 2 in operation.

FIG. 3 is a signal timing diagram of the shift register unit illustrated in FIG. 2 in operation. The working principle of the shift register unit illustrated in FIG. 2 is briefly described below with reference to the signal timing diagram illustrated in FIG. 3. As illustrated in FIG. 3, the working process of the shift register unit illustrated in FIG. 2 includes three phases, namely the first phase t1 (also called the input phase), the second phase t2 (also called the output phase), and the maintaining phase (including the third phase t3, the fourth phase t4, the fifth phase t5, etc.). FIG. 3 illustrates the timing waveforms of the various signals in each phase.

In the first phase t1, as illustrated in FIG. 3, the clock signal CK is at a low level, the clock signal CB is at a high level, and the signal input terminal IN is at a low level (that is, the signal input terminal IN receives a low-level input signal), so that the transistors M1, M3, and M10 are turned on, and the transistor M7 is turned off. The turned-on transistor M1 transmits the low-level input signal to the node PD_in to allow the level of the node PD_in to become a low level, so that the transistor M2 is turned on. Because the transistor M8 is always in the turn-on state in response to the first voltage VSS (at a low level), the level of the node PD_out is the same as the level of the node PD_in, that is, the low level, so that the low level is stored in the capacitor C02, and the transistor M5 is turned on. The turned-on transistor M3 allows the first voltage VSS (at a low level) to be transmitted to the node PU, and the turned-on transistor M2 allows the low level of the clock signal CK to be transmitted to the node PU, so that the level of the node PU becomes a low level and is stored in the capacitor C01. The transistor M4 is turned on in response to the low level of the node PU, and allows the second voltage VDD (at a high level) to be output to the cascaded signal output terminal GP, and at the same time, the transistor M5 is turned on in response to the low level of the node PD_out and allows the high level of the clock signal CB to be transmitted to the cascaded signal output terminal GP, so that in this phase, the cascaded signal output terminal GP of the shift register unit outputs a high level, and accordingly, the transistors M9 and M11 are turned off in response to the high level of the cascaded signal output terminal GP. In addition, the turned-on transistor M10 allows the first voltage VSS (at a low level) to be transmitted to the node PD_ox, so that the level of the node PD_ox becomes a low level and is stored in the capacitors C03 and C04. The transistor M12 is turned on in response to the low level of the node PD_ox and outputs the first voltage VSS (at a low level) to the scanning signal output terminal OUT, so that in this phase, the scanning signal output terminal OUT of the shift register unit outputs a low level.

In the second phase t2, as illustrated in FIG. 3, the clock signal CK is at a high level, the clock signal CB is at a low level, and the signal input terminal IN is at a high level, so that the transistors M1, M3, and M10 are turned off, and the transistor M7 is turned on. Due to the storage function of the capacitor C02, the node PD_in and the node PD_out can continue to maintain the low level of the previous phase, so that the transistors M2 and M5 are turned on. The turned-on transistor M2 transmits the high level of the clock signal CK to the node PU, thereby allowing the level of the node PU to be changed to a high level. The transistor M4 is turned off in response to the high level of the node PU, so as to avoid outputting the second voltage VDD (at a high level) the cascaded signal output terminal GP. The turned-on transistor M5 transmits the low level of the clock signal CB to the cascaded signal output terminal GP, so that in this phase, the cascaded signal output terminal GP of the shift register unit outputs a low level. For example, the low level may be used as the input signal of the next shift register unit, and of course, may also be used to control the operation of the P-type transistor in the pixel circuit S illustrated in FIG. 1. In addition, the transistor M9 is turned on in response to the low level of the cascaded signal output terminal GP and transmits the second voltage VDD (at a high level) to the node PD_ox, so that the level of the node PD_ox becomes a high level, and accordingly, the transistor M12 is turned off. The transistor M11 is turned on in response to the low level of the cascaded signal output terminal GP and outputs the second voltage VDD (at a high level) to the scanning signal output terminal OUT, so that in this phase, the scanning signal output terminal OUT of the shift register unit outputs a high level, and for example, the high level may be used to control the operation of the N-type transistor in the pixel circuit S illustrated in FIG. 1.

In the third phase t3 of the maintaining phase, as illustrated in FIG. 3, the clock signal CK is at a low level, the clock signal CB is at a high level, and the signal input terminal IN is at a high level, so that the transistors M1, M3, and M10 are turned on, and the transistor M7 is turned off. The turned-on transistor M1 transmits the high level of the signal input terminal IN to the node PD_in and the node PD_out (the transistor M8 is always turned on), so that the level of the node PD_in and the level of the node PD_out become a high level, and accordingly, the transistors M2 and M5 are turned off. The turned-on transistor M3 transmits the first voltage VSS (at a low level) to the node PU, so that the level of the node PU becomes a low level and is stored in the capacitor C01. The transistor M4 is turned on in response to the low level of the node PU and allows the second voltage VDD (at a high level) to be output to the cascaded signal output terminal GP, so that in this phase, the cascaded signal output terminal GP of the shift register unit outputs a high level, and accordingly, the transistors M9 and M11 are turned off in response to the high level of the cascaded signal output terminal GP. In addition, the turned-on transistor M10 transmits the first voltage VSS (at a low level) to the node PD_ox, thereby allowing the level of the node PD_ox to become a low level and to be stored in the capacitor C03 and the capacitor C04. The transistor M12 is turned on in response to the low level of the node PD_ox and allows the first voltage VSS (at a low level) to be output to the scanning signal output terminal OUT, so that in this phase, the scanning signal output terminal OUT of the shift register unit outputs a low level.

In the fourth phase t4 of the maintaining phase, as illustrated in FIG. 3, the clock signal CK is at a high level, the clock signal CB is at a low level, and the signal input terminal IN is at a high level, so that the transistors M1, M3, and M10 are turned off, and the transistor M7 is turned on. Due to the storage function of the capacitor C02, the node PD_in and the node PD_out can continue to maintain the high level of the previous phase, so that the transistors M2 and M5 are turned off. Due to the storage function of the capacitor C01, the node PU continues to maintain the low level of the previous phase, so that the transistors M4 and M6 are turned on. The second voltage VDD (at a high level) is transmitted to the node PD_in and the node PD_out through the turned-on transistor M6 and the turned-on transistor M7, so that the node PD_in and the node PD_out remain a high level, which can effectively prevent the transistor M5 from being turned on, thereby avoiding error output. At the same time, the turned-on transistor M4 outputs the second voltage VDD (at a high level) to the cascaded signal output terminal GP, so that in this phase, the cascaded signal output terminal GP of the shift register unit outputs a high level, and accordingly, the transistors M9 and M11 are turned off in response to the high level of the cascaded signal output terminal GP. In addition, the clock signal CB changes from a high level to a low level, and due to the bootstrap effect of the capacitor C03, the level of the node PD_ox is further pulled down, so that the transistor M12 is further turned on, and the first voltage VSS (at a low level) is output to the scanning signal output terminal OUT. Thus, in this phase, the scanning signal output terminal OUT of the shift register unit outputs a low level, that is, the noise reduction of the scanning signal output terminal OUT is realized.

In the fifth phase t5 of the maintaining phase, as illustrated in FIG. 3, the clock signal CK is at a low level, the clock signal CB is at a high level, and the signal input terminal IN is at a high level, so that the transistors M1 and M3 are turned on, and the transistor M7 is turned off. The turned-on transistor M1 transmits the high level of the signal input terminal IN to the node PD_in and the node PD_out (the transistor M8 is always in the turn-on state), so that the level of the node PD_in and the level of the node PD_out remain at a high level, and accordingly, the transistors M2 and M5 are turned off. The turned-on transistor M3 transmits the first voltage VSS (at a low level) to the node PU to allow the level of the node PU to remain at a low level, so that the transistors M4 and M6 remain being turned on. The second voltage VDD (at a high level) is transmitted to the node PD_in and the node PD_out through the turned-on transistor M6 and the turned-on transistor M7, so that the node PD_in and the node PD_out remain at a high level, which can effectively prevent the transistor M5 from being turned on, thereby avoiding error output. At the same time, the turned-on transistor M4 outputs the second voltage VDD (at a high level) to the cascaded signal output terminal GP, so that in this phase, the cascaded signal output terminal GP of the shift register unit outputs a high level, and accordingly, the transistors M9 and M11 remain being turned off in response to the high level of the cascaded signal output terminal GP. In addition, the level of the clock signal CK is low, and the level of the node PD_ox is also low. Because the threshold voltage Vth of the P-type transistor is generally negative, the gate-source voltage difference of the transistor M10 is Vgs, and Vgs>Vth, and because the P-type transistor is turned on when Vgs<Vth, the transistor M10 is turned off at this time. Because the transistors M9 and M11 are also turned off, the node PD_ox and the scanning signal output terminal OUT are in the floating state. The level of the clock signal CB becomes a high level, and due to the bootstrap effect of the capacitor C03, the level of the node PD_ox may be slightly pulled up, so that the transistor M12 is turned off, and the first voltage VSS (at a low level) cannot be continuously output to the scanning signal output terminal OUT, that is, in this phase, the continuous noise reduction of the scanning signal output terminal OUT cannot be achieved.

Figure 5:
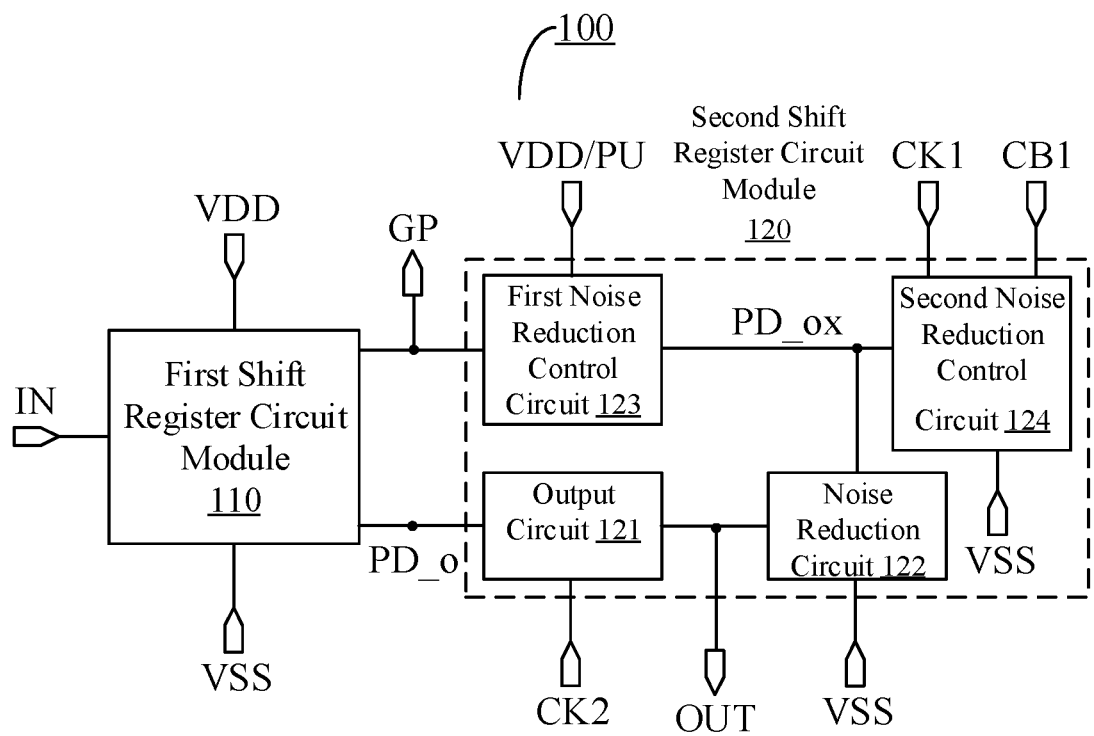
FIG. 5 is a schematic block diagram of a shift register unit provided by some embodiments of the present disclosure.

Based on the above, it can be seen that because the clock signal CK and the clock signal CB are alternately at a high level and a low level, the fourth phase t4 and the fifth phase t5 of the maintaining phase appear alternately, so that in the maintaining phase, the transistor M10 cannot be used for achieving the noise reduction of the scanning signal output terminal OUT during nearly half of the time (that is, the fifth phase t5 in the maintaining phase), which leads to the fact that under the condition of external interference, the shift register unit cannot be performed noise reduction in time during the maintaining phase, and the scanning signal output terminal OUT may generate loud noise. As illustrated in FIG. 5, by the simulation test, in the maintaining phase, the output noise of the scanning signal output terminal OUT may reach 2V.

At least some embodiments of the present disclosure provide a shift register unit, which includes a first shift register circuit module and a second shift register circuit module. The first shift register circuit module is configured to output a first output signal at a first output terminal according to an input signal received by an input terminal and is configured to provide a turn-on control signal to the second shift register circuit module. The second shift register circuit module comprises an output circuit, a noise reduction circuit, a first noise reduction control circuit, and a second noise reduction control circuit; the output circuit is configured to output a second output signal at a second output terminal in response to the turn-on control signal; the noise reduction circuit is configured to perform noise reduction on the second output terminal under control of a level of a first noise reduction control node; the first noise reduction control circuit is configured to control the level of the first noise reduction control node to turn off the noise reduction circuit in response to the first output signal; and the second noise reduction control circuit is configured to adjust the level of the first noise reduction control node to turn on the noise reduction circuit under control of a first clock signal and a second clock signal. The second noise reduction control circuit comprises a first control circuit, a first coupling circuit, a second coupling circuit, a transmission circuit, and a storage circuit; the first control circuit is configured to transmit a first voltage to a second noise reduction control node under control of the first clock signal; the first coupling circuit is configured to store a level of the second noise reduction control node and adjust the level of the second noise reduction control node under control of the second clock signal; the second coupling circuit is configured to store the level of the second noise reduction control node and reduce an adjustment magnitude of the first coupling circuit in case of adjusting the level of the second noise reduction control node; the transmission circuit is configured to connect the first noise reduction control node and the second noise reduction control node to balance the level of the first noise reduction control node and the level of the second noise reduction control node; and the storage circuit is configured to store the level of the first noise reduction control node.

Some embodiments of the present disclosure further provide a gate driving circuit, a display device, and a method for driving the shift register unit, which correspond to the above-mentioned shift register unit.

In the shift register unit provided by some embodiments of the present disclosure, by providing a second noise reduction control circuit with a charge pump structure formed by a first control circuit, a first coupling circuit, a second coupling circuit, a transmission circuit, and a storage circuit, the adjustment effect of the charge pump structure on the voltage can be used to adjust the level of the first noise reduction control node. Thus, in one aspect, it ensures that the noise reduction circuit is continuously turned on in the maintaining phase to remove noise interference in time, and in another aspect, the biasing effect of the level of the first noise reduction control node on the noise reduction circuit can be reduced, thereby prolonging the service life of the shift register unit.

Hereinafter, several embodiments of the present disclosure will be described in detail with reference to the accompanying drawings. It should be noted that, in order to keep the description of the embodiments of the present disclosure clear and concise, detailed descriptions of well-known functions and well-known parts (elements) may be omitted. When any part (element) of the embodiments of the present disclosure appears in more than one drawing, the part (element) is denoted by the same or similar reference numeral in each drawing.

FIG. 5 is a schematic block diagram of a shift register unit according to some embodiments of the present disclosure. As illustrated in FIG. 5, the shift register unit 100 includes a first shift register circuit module 110 and a second shift register circuit module 120 (as illustrated by the dotted block in FIG. 5), which can respectively output a first output signal at a first output terminal GP and a second output signal at a second output terminal OUT based on an input signal received by an input terminal IN.

For example, agate driving circuit can be obtained by cascading a plurality of shift register units 100 (for example, referring to the gate driving circuit illustrated in FIG. 1), and the gate driving circuit can be used to drive such as a liquid crystal display panel, an organic light-emitting diode display panel, or the like.

For example, as illustrated in FIG. 5, the first shift register circuit module 110 is configured to output a first output signal (e.g., a low-level signal) at a first output terminal GP according to an input signal received by an input terminal IN and is configured to provide a turn-on control signal to the second shift register circuit module 120. For example, in some embodiments, as illustrated in FIG. 5, the first shift register circuit module 110 may include a second node PD_o (described later), which may provide the turn-on control signal to the second shift register circuit module 120 through the second node PD_o. For example, in some embodiments, referring to FIG. 1, the first output terminal of the current shift register unit 100 may be connected to the signal input terminal IN of the next shift register unit 100, that is, the first output signal of the current shift register unit 100 may be used as the input signal of the next shift register unit 100. For example, in some embodiments, the first output terminal GP may also be connected to a P-type transistor in the pixel circuit through, for example, a gate line, so as to transmit a control signal to the P-type transistor to control the P-type transistor to be turned on or turned off.

For example, as illustrated in FIG. 5, the second shift register circuit module 120 includes an output circuit 121, a noise reduction circuit 122, a first noise reduction control circuit 123, and a second noise reduction control circuit 124.

For example, the output circuit 121 is configured to output a second output signal (e.g., a high-level signal) at the second output terminal OUT in response to the turn-on control signal. For example, in some embodiments, as illustrated in FIG. 5, the output circuit 121 is connected to the second node PD_o, the third clock signal terminal CK2, and the second output terminal OUT, and is configured to be turned on under control of the turn-on control signal (the turn-on control signal is formed by change of the level of the second node PD_o), so that the third clock signal CK2 provided by the third clock signal terminal CK2 is transmitted to the second output terminal OUT and is used as the second output signal to be output at the second output terminal OUT. For example, in some embodiments, the output circuit 121 may be connected to the first output terminal GP, the third clock signal terminal CK2, and the second output terminal OUT, and is configured to be turned on under control of the turn-on control signal (the first output signal provided by the first output terminal GP serves as the turn-on control signal), so that the third clock signal CK2 provided by the third clock signal terminal CK2 is transmitted to the second output terminal OUT, which serves as the second output signal output at the second output terminal OUT.

For example, the noise reduction circuit 122 is configured to perform noise reduction on the second output terminal OUT under control of the level of the first noise reduction control node PD_ox. For example, in some embodiments, as illustrated in FIG. 5, the noise reduction circuit 122 connected to the first noise reduction control node PD_ox, the first voltage terminal VSS, and the second output terminal OUT, and is configured to be turned on under control of the level of the first noise reduction control node PD_ox, so as to transmit the first voltage VSS provided by the first voltage terminal VSS (for example, the first voltage VSS may be at a low level, but is not limited thereto) to the second output terminal OUT to perform noise reduction on the second output terminal OUT.

For example, the first noise reduction control circuit 123 is configured to control the level of the first noise reduction control node PD_ox to turn off the noise reduction circuit 122 in response to the first output signal. For example, in some embodiments, as illustrated in FIG. 5, the first noise reduction control circuit 123 is connected to the first output terminal GP, the first signal terminal VDD/PU, and the first noise reduction control node PD_ox, and is configured to transmit the first signal level of the first signal terminal VDD/PU to the first noise reduction control node PD_ox to control (e.g., pull up) the level of the first noise reduction control node PD_ox in response to the first output signal provided by the first output terminal GP, so that the noise reduction circuit 122 is turned off. For example, in some embodiments, the first signal terminal VDD/PU may be the second voltage terminal VDD providing the second voltage VDD (e.g., the second voltage VDD may be at a high level, but is not limited thereto). For example, in some embodiments, the first shift register circuit module 110 may include a first node PU (described later). As illustrated in FIG. 5, the first signal terminal is connected to the first node PU in the first shift register circuit module 110, so that the first noise reduction control circuit 123 can transmit the level (e.g., a high level) of the first node PU to the first noise reduction control node PD_ox to control (e.g., pull up) the level of the first noise reduction control node PD_ox in response to the first output signal provided by the first output terminal GP, so that the noise reduction circuit 122 is turned off.

For example, the second noise reduction control circuit 124 is configured to adjust the level of the first noise reduction control node PD_ox under control of the first clock signal CK1 and the second clock signal CB1, so as to turn on the noise reduction circuit. For example, in some embodiments, as illustrated in FIG. 5, the second noise reduction control circuit 124 is connected to the first clock signal terminal CK1, the second clock signal terminal CB1, the first voltage terminal VSS, and the first noise reduction control node PD_ox, and is configured to adjust the level of the first noise reduction control node PD_ox based on the first voltage VSS provided by the first voltage terminal VSS to turn on the noise reduction circuit under control of the first clock signal CK1 provided by the first clock signal terminal CK1 and the second clock signal CB1 provided by the second clock signal terminal CB1.

Figure 6:
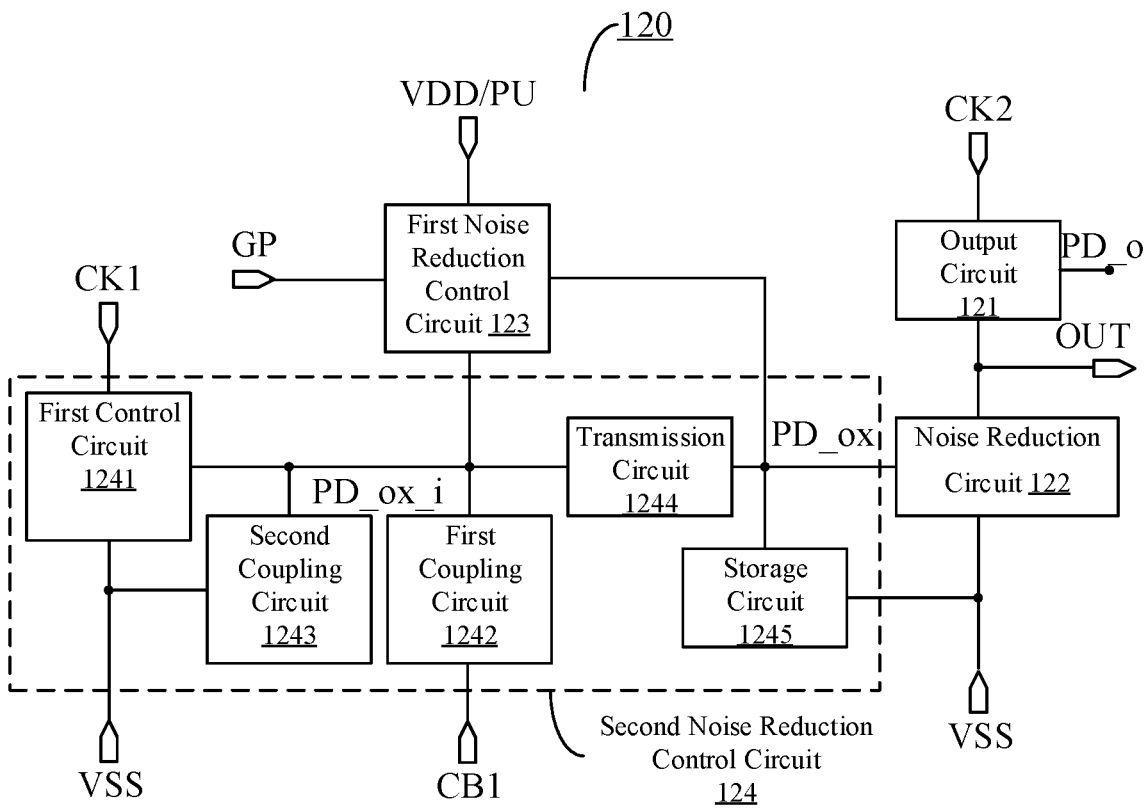
FIG. 6 is a schematic block diagram of a second shift register circuit module provided by some embodiments of the present disclosure.

FIG. 6 is a schematic block diagram of a second shift register circuit module 120 provided by some embodiments of the present disclosure. For example, as illustrated in FIG. 6, in the second shift register circuit module 120, the second noise reduction control circuit 124 may include a first control circuit 1241, a first coupling circuit 1242, a second coupling circuit 1243, a transmission circuit 1244, and a storage circuit 1245.

For example, the first control circuit 1241 is configured to transmit the first voltage VSS the second noise reduction control node PD_ox_i under control of the first clock signal CK1. For example, in some embodiments, as illustrated in FIG. 6, the first control circuit 1241 is connected to the first clock signal terminal CK1, the first voltage terminal VSS, and the second noise reduction control node PD_ox_i, and is configured to transmit the first voltage VSS provided by the first voltage terminal VSS to the second noise reduction control node PD_ox_i under control of the first clock signal CK1 provided by the first clock signal terminal CK1.

For example, the first coupling circuit 1242 is configured to store the level of the second noise reduction control node PD_ox_i and to adjust the level of the second noise reduction control node PD_ox_i under control of the second clock signal CB1. For example, in some embodiments, as illustrated in FIG. 6, the first coupling circuit 1242 is connected to the second noise reduction control node PD_ox_i and the second clock signal terminal CB1. For example, in the case where the level of the second clock signal CB1 provided by the second clock signal terminal CB1 changes, due to the coupling effect (e.g., the bootstrap effect) of the first coupling circuit 1242, the level of the second noise reduction control node PD_ox_i also changes accordingly, so that the first coupling circuit 1242 can adjust the level of the second noise reduction control node PD_ox_i under control of the second clock signal CB1.

For example, the second coupling circuit 1243 is configured to store the level of the second noise reduction control node PD_ox_i and reduce the adjustment magnitude of the first coupling circuit 1242 in case of adjusting the level of the second noise reduction control node PD_ox_i. For example, in some embodiments, as illustrated in FIG. 6, the second coupling circuit 1243 is connected to the second noise reduction control node PD_ox_i and the first voltage terminal VSS. For example, because the second coupling circuit 1243 also has the coupling effect, in the case where the level of the second clock signal CBT provided by the second clock signal terminal CBT changes, the coupling effect of the second coupling circuit 1243 and the coupling effect of the first coupling circuit 1242 work simultaneously, so that the adjustment magnitude of the first coupling circuit 1242 in case of adjusting the level of the second noise reduction control node PD_ox_i can be reduced.

For example, the transmission circuit 1244 is configured to connect the first noise reduction control node PD_ox and the second noise reduction control node PD_ox_i, so as to balance the level of the first noise reduction control node PD_ox and the level of the second noise reduction control node PD_ox_i. For example, in the case where the level of the second noise reduction control node PD_ox_i changes, the transmission circuit 1244 can balance the level of the first noise reduction control node PD_ox and the level of the second noise reduction control node PD_ox_i by transferring charges (the first coupling circuit 1242 and the second coupling circuit 1243 store the level of the second noise reduction control node PD_ox_i by storing charges, and the storage circuit 1245 stores the level of the first noise reduction control node PD_ox by storing charges).

For example, the storage circuit 1245 is configured to store the level of the first noise reduction control node PD_ox. For example, in some embodiments, as illustrated in FIG. 6, the storage circuit 1245 is connected to the first noise reduction control node PD_ox and the first voltage terminal VSS.

For example, the first control circuit 1241, the first coupling circuit 1242, the second coupling circuit 1243, the transmission circuit 1244, and the storage circuit 1245 described above form a charge pump structure. The second noise reduction control circuit 124 can adjust the level of the first noise reduction control node PD_ox by using the charge pump structure to adjust the voltage. Thus, in one aspect, it is ensured that the noise reduction circuit 122 is continuously turned on in the maintaining phase, and noise interference is removed in time; and in another aspect, the bias effect of the level of the first noise reduction control node PD_ox on the noise reduction circuit 122 is reduced, thereby prolonging the service life of the shift register unit 100. For example, in some embodiments, under regulation of the second noise reduction control circuit 124, the difference between the level of the first noise reduction control node PD_ox and the first voltage VSS is n times the threshold voltage of the noise reduction circuit 122, where 1≤n≤10.

Figure 7:
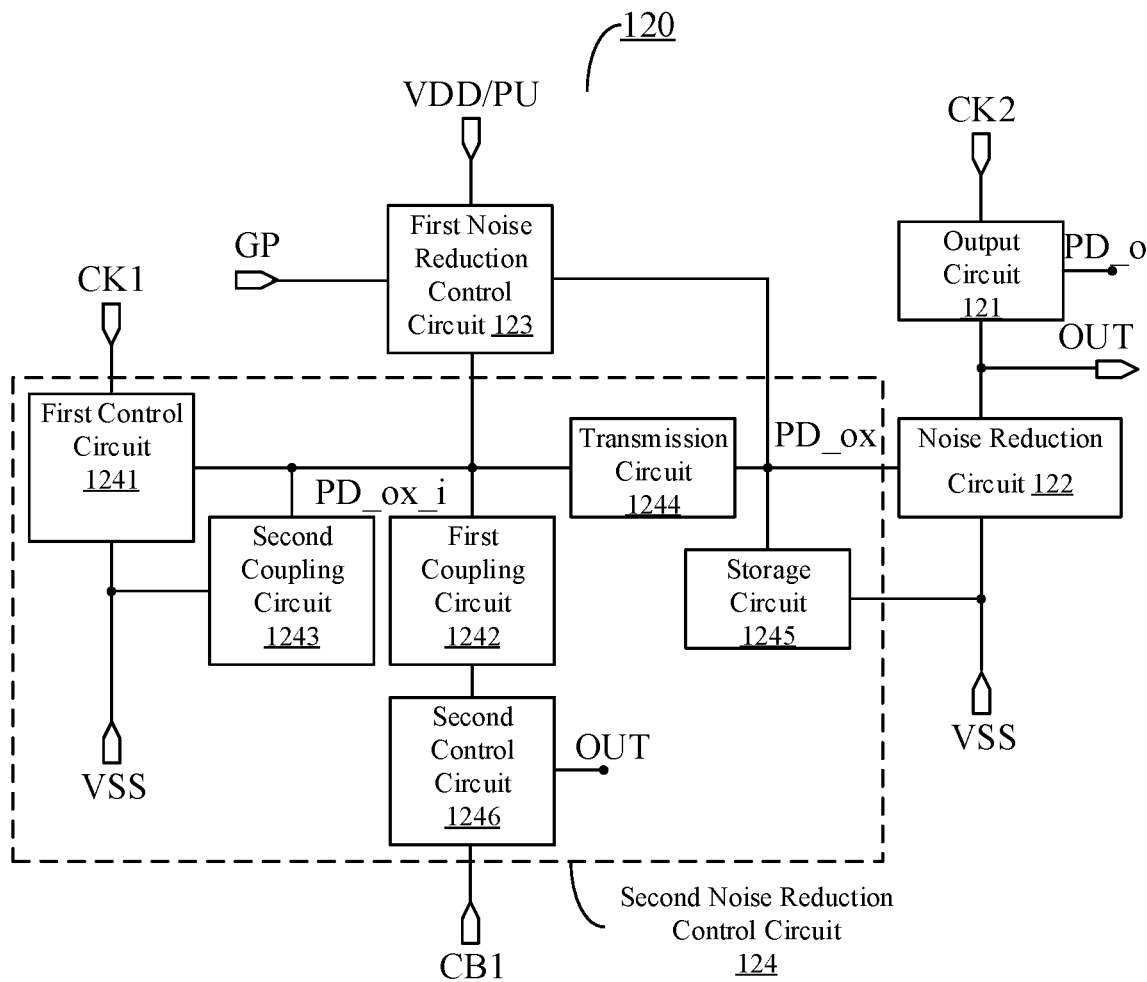
FIG. 7 is a schematic block diagram of another second shift register circuit module provided by some embodiments of the present disclosure.

FIG. 7 is a schematic block diagram of another second shift register circuit module 120 provided by some embodiments of the present disclosure. For example, as illustrated in FIG. 7, in the second shift register circuit module 120, the second noise reduction control circuit 124 may further include a second control circuit 1246 based on the circuit structure illustrated in FIG. 6. It should be noted that other circuit structures of the second shift register circuit module 120 illustrated in FIG. 7 are basically the same as those of the second shift register circuit module 120 illustrated in FIG. 6, and details are not repeated here.

For example, the second control circuit 1246 is configured to transmit the second clock signal CB1 to the first coupling circuit 1242 under control of the level of the second output terminal OUT. For example, as illustrated in FIG. 6, the second control circuit 1246 is connected to the second output terminal OUT, the first clock signal terminal CB1, and the first coupling circuit 1242. For example, in some embodiments, in the case where the second output terminal OUT outputs the second output signal, the second control circuit is turned off in response to the second output signal, so that the second clock signal CBT cannot be transmitted to the first coupling circuit 1242, thereby reducing the unfavorable coupling of the second clock signal terminal CB1 and reducing the power consumption at the same time; and in the case where the noise reduction circuit 122 performs noise reduction on the second output terminal OUT, the level of the second output terminal OUT may allow the second control circuit 1246 to be turned on, so that the first clock signal CBT can be transmitted to the first coupling circuit 1242 through the turned-on second control circuit 1246.

For example, in some embodiments, as illustrated in FIG. 6 and FIG. 7, the first noise reduction control circuit 123 may also be connected to the second noise reduction control node PD_ox_i, and is further configured to control the level of the second noise reduction control node PD_ox_i in response to the first output signal. For example, in some embodiments, the first noise reduction control circuit 123 is further configured to transmit the first signal level (e.g., a high level) of the first signal terminal VDD/PU to the second noise reduction control node PD_ox_i in response to the first output signal provided by the first output terminal GP, so as to control (e.g., pull up) the level of the second noise reduction control node PD_ox_i.

Figure 8:
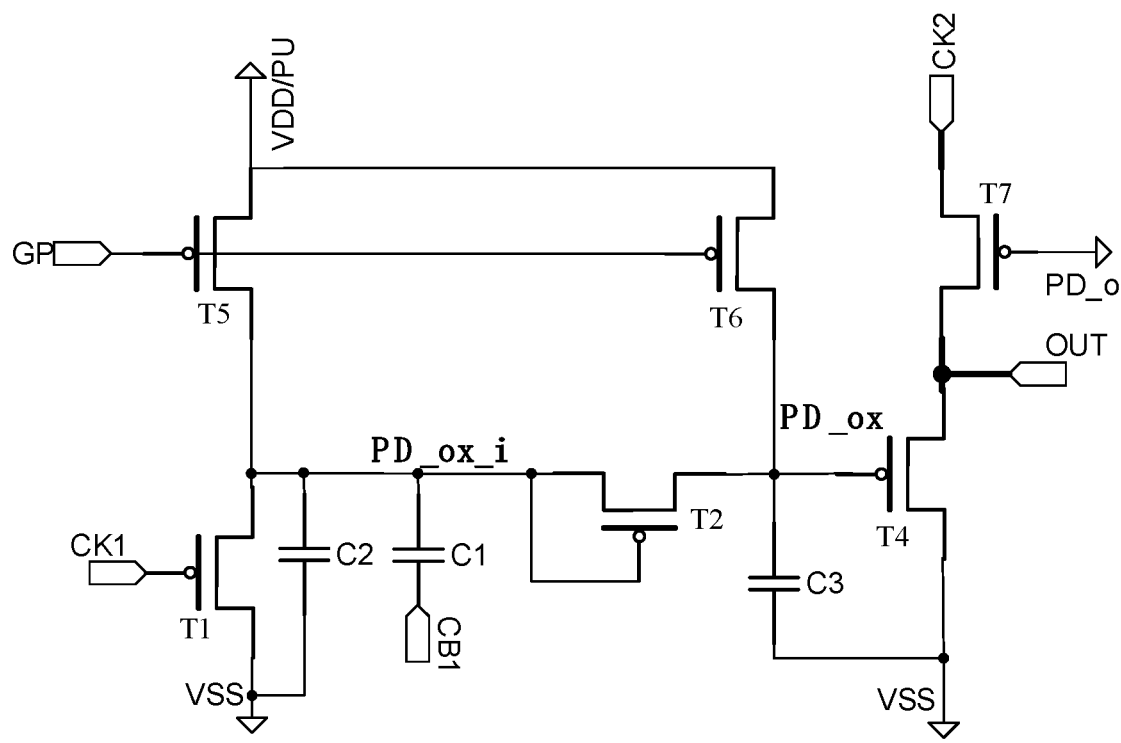
FIG. 8 is a schematic diagram of a circuit structure of a specific implementation example of the second shift register circuit module illustrated in FIG. 6.

FIG. 8 is a schematic diagram of a circuit structure of a specific implementation example of the second shift register circuit module 120 illustrated in FIG. 6. As illustrated in FIG. 8, the second shift register circuit module 120 includes a first transistor T1, a second transistor T2, a fourth transistor T4, a fifth transistor T5, a sixth transistor T6, and a seventh transistor T7, and further includes a first capacitor C1, a second capacitor C2, and a third capacitor C3. It should be noted that, in the following description, each transistor is a P-type transistor as an example for description, but this does not constitute a limitation to the embodiments of the present disclosure.

For example, the first control circuit 1241 may be implemented as the first transistor T1 illustrated in FIG. 8. As illustrated in FIG. 8, a gate electrode of the first transistor T1 is connected to the first clock signal terminal CK1 to receive the first clock signal CK1, a first electrode of the first transistor T1 is connected to the first voltage terminal VSS to receive the first voltage VSS, and a second electrode of the first transistor T1 is connected to the second noise reduction control node PD_ox_i. Generally, when the first clock signal CK1 is at an active level (e.g., at a low level), the first transistor T1 is turned on to connect the second noise reduction control node PD_ox_i with the first voltage terminal VSS, so that the level of the second noise reduction control node PD_ox_i is the same as the level of the first voltage VSS (both at a low level).

For example, the first coupling circuit 1242 may be implemented as the first capacitor C1 illustrated in FIG. 8. As illustrated in FIG. 8, a first electrode of the first capacitor C1 is connected to the second noise reduction control node PD_ox_i, and a second electrode of the first capacitor C1 is connected to the second clock signal terminal CB1 to receive the second clock signal CB1. The first capacitor C1 is used to store the level of the second noise reduction control node PD_ox_i; and simultaneously, the first capacitor C1 has the coupling effect, and in the case where the level of the second clock signal CB1 provided by the second clock signal terminal CB1 changes, due to the coupling effect (for example, the bootstrap effect) of the first capacitor C1, the level of the second noise reduction control node PD_ox_i may also change accordingly, so that the first capacitor C1 can adjust the level of the second noise reduction control node PD_ox_i under control of the second clock signal CB1.

For example, the second coupling circuit 1243 may be implemented as the second capacitor C2 illustrated in FIG. 8. As illustrated in FIG. 8, a first electrode of the second capacitor C2 is connected to the second noise reduction control node PD_ox_i, and a second electrode of the second capacitor C2 is connected to the first voltage terminal VSS to receive the first voltage VSS. The second capacitor C2 is also used to store the level of the second noise reduction control node PD_ox_i; and simultaneously, the second capacitor C2 also has the coupling effect, so that in the case where the level of the second clock signal CB1 provided by the second clock signal terminal CB1 changes, the coupling effect of the second capacitor C2 and the coupling effect of the first capacitor C1 work simultaneously, and further, the adjustment magnitude of the first capacitor C1 in case of adjusting the level of the second noise reduction control node PD_ox_i can be reduced.

For example, the transmission circuit 1244 may be implemented as the second transistor T2 illustrated in FIG. 8. As illustrated in FIG. 8, a gate electrode of the second transistor T2 is connected to the second noise reduction control node PD_ox_i, a first electrode of the second transistor T2 is connected to the first noise reduction control node PD_ox, and a second electrode of the second transistor T2 is connected to the second noise reduction control node PD_ox_i. Generally, when the second noise reduction control node PD_ox_i is at an active level (e.g., at a low level), the second transistor T2 is turned on to connect the first noise reduction control node PD_ox with the second noise reduction control node PD_ox_i, so that the level of the first noise reduction control node PD_ox is the same as the level of the second noise reduction control node PD_ox_i (both at a low level).

For example, the storage circuit 1245 may be implemented as the third capacitor C3 illustrated in FIG. 8. As illustrated in FIG. 8, a first electrode of the third capacitor C3 is connected to the first noise reduction control node PD_ox, and a second electrode of the third capacitor C3 is connected to the first voltage terminal VSS to receive the first voltage VSS. The third capacitor C3 is used to store the level of the first noise reduction control node PD_ox, and is used to control the fourth transistor T4 to be turned on or turned off in the subsequent phase.

In other words, the second noise reduction control circuit 124 may be implemented as the first transistor T1, the second transistor T2, the first capacitor C1, the second capacitor C2, and the third capacitor C3 illustrated in FIG. 8. The first transistor T1, the second transistor T2, the first capacitor C1, the second capacitor C2, and the third capacitor C3 illustrated in FIG. 8 form a charge pump structure, and the voltage regulation effect of the charge pump structure can be used to adjust the level of the first noise reduction control node PD_ox. Thus, in one aspect, it is ensured that the fourth transistor T4 is continuously turned on in the maintaining phase, and the noise interference removed in time; and in another aspect, the bias effect of the level of the first noise reduction control node PD_ox on the fourth transistor T4 can be reduced, thereby prolonging the service life of the shift register unit 100. For example, in some embodiments, by reasonably setting the capacitance values of the first capacitor C1 and the second capacitor C2, under the adjustment of the above-mentioned charge pump structure (i.e., the second noise reduction control circuit 124), the difference between the level of the first noise reduction control node PD_ox and the first voltage VSS is n times the threshold voltage of the noise reduction circuit 122, where $1 \leq n \leq 10$.

For example, the noise reduction circuit 122 may be implemented as the fourth transistor T4 illustrated in FIG. 8. As illustrated in FIG. 8, a gate electrode of the fourth transistor T4 is connected to the first noise reduction control node PD_ox, a first electrode of the fourth transistor T4 is connected to the first voltage terminal VSS to receive the first voltage VSS, and a second electrode of the fourth transistor T4 is connected to the second output terminal OUT. Generally, when the first noise reduction control node PD_ox is at an active level (e.g., at a low level), the fourth transistor T4 is turned on to connect the second output terminal OUT with the first voltage terminal VSS, so as to allow the first voltage VSS provided by the first voltage terminal VSS to be output at the second output terminal OUT, thereby performing noise reduction on the second output terminal OUT.

For example, the first noise reduction control circuit 123 may be implemented as the fifth transistor T5 and the sixth transistor T6 illustrated in FIG. 8. As illustrated in FIG. 8, a gate electrode of the fifth transistor T5 is connected to the first output terminal GP to receive the first output signal, a first electrode of the fifth transistor T5 is connected to the first signal terminal VDD/PU to receive the first signal level, and a second electrode of the fifth transistor T5 is connected to the first noise reduction control node PD_ox; and a gate electrode of the sixth transistor T6 is connected to the first output terminal GP to receive the first output signal, a first electrode of the sixth transistor T6 is connected to the first signal terminal VDD/PU to receive the first signal level, and a second electrode of the sixth transistor T6 is connected to the second noise reduction control node PD_ox_i. For example, in some embodiments, the first signal terminal VDD/PU may be the second voltage terminal VDD for providing the second voltage VDD (e.g., the second voltage VDD may be at a high level, but is not limited thereto), and in this case, the first signal level is the second voltage VDD. For example, in other embodiments, the first signal terminal VDD/PU may be connected to the first node PU in the first shift register circuit module 110, where the first signal level is the level (e.g., a high level) of the first node PU. It should be noted that the present disclosure includes but is not limited to the above situations. Generally, when the first output signal of the first output terminal GP is at an active level (e.g., at a low level), the fifth transistor T5 and the sixth transistor T6 are turned on at the same time. The turned-on fifth transistor T5 connects the second noise reduction control node PD_ox_i with the first signal terminal VDD/PU, so as to transmit the first signal level (e.g., a high level) provided by the first signal terminal VDD/PU to the second noise reduction control node PD_ox_i, thereby realizing the control of the level of the second noise reduction control node PD_ox_i. The turned-on sixth transistor T6 connects the first noise reduction control node PD_ox with the first signal terminal VDD/PU to transmit the first signal level (e.g., a high level) provided by the first signal terminal VDD/PU to the first noise reduction control node PD_ox, so as to control the level of the first noise reduction control node PD_ox, so that the fourth transistor T4 can be turned on (i.e., the noise reduction circuit 122 can be turned off).

For example, the output circuit 121 may be implemented as the seventh transistor T7 illustrated in FIG. 8. As illustrated in FIG. 8, a gate electrode of the seventh transistor T7 is connected to the second signal terminal to receive the turn-on control signal, a first electrode of the seventh transistor T7 is connected to the third clock signal terminal CK2 to receive the third clock signal CK2, and a second electrode of the seventh transistor T7 is connected to the second output terminal OUT. For example, in some embodiments, the second signal terminal may be connected to the second node PD_o in the first shift register circuit module 110, and in this case, the level change of the second node PD_o forms the turn-on control signal. When the turn-on control signal is at an active level (for example, at a low level), the seventh transistor T7 is turned on to connect the third clock signal terminal CK2 with the second output terminal OUT, so that the third clock signal CK2 provided by the third clock signal terminal CK2 is output to the second output terminal OUT as the second output signal.

Figure 9:
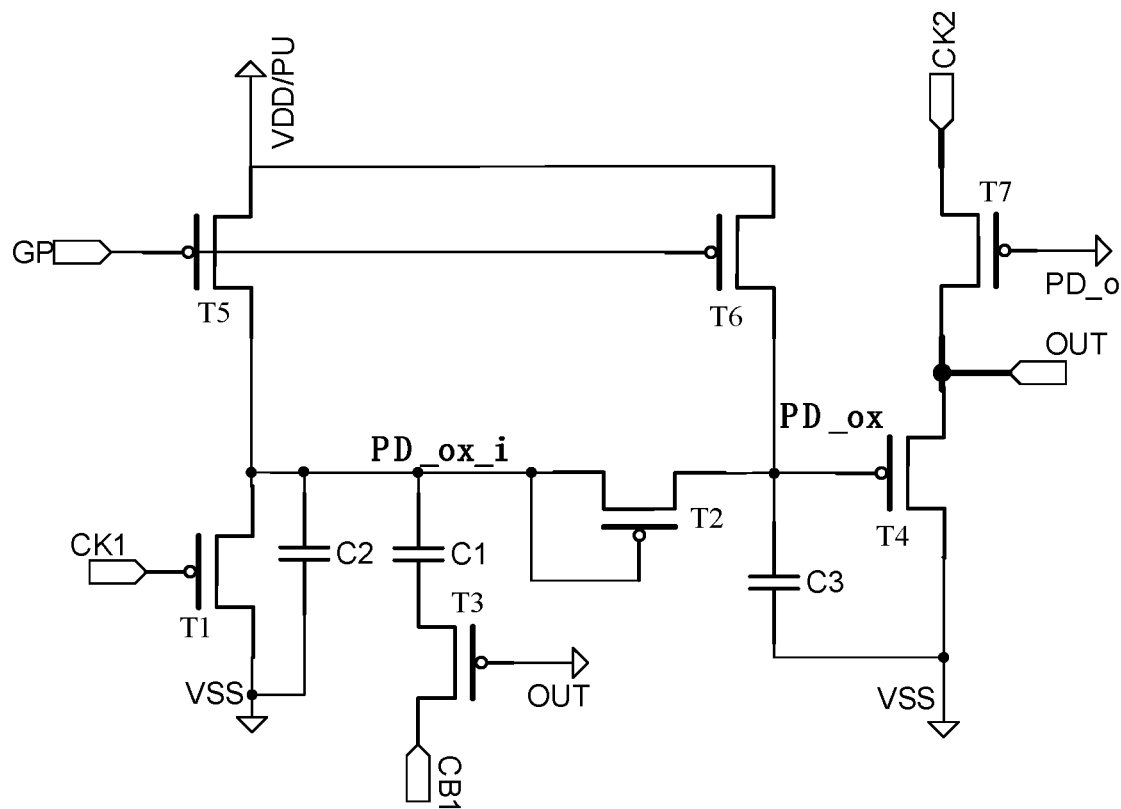
FIG. 9 is a schematic diagram of a circuit structure of a specific implementation example of the second shift register circuit module illustrated in FIG. 7.

FIG. 9 is a schematic diagram of a circuit structure of a specific implementation example of the second shift register circuit module 120 illustrated in FIG. 7. As illustrated in FIG. 9, based on the circuit structure illustrated in FIG. 8, the second shift register circuit module 120 further includes a third transistor T3 for implementing the second control circuit 1246. It should be noted that other circuit structures of the second shift register circuit module 120 illustrated in FIG. 9 are basically the same as those of the second shift register circuit module 120 illustrated in FIG. 8, and details are not repeated here.

As illustrated in FIG. 9, the second electrode of the first capacitor C1 is connected to the second clock signal terminal CB1 through the third transistor T3. A gate electrode of the third transistor T3 is connected to the second output terminal OUT, a first electrode of the third transistor T3 is connected to the second clock signal terminal CB1, and a second electrode of the third transistor T3 is connected to the second electrode of the first capacitor C1. For example, in the case where the second output terminal OUT outputs the second output signal (e.g., a high-level signal), the third transistor T3 is turned off in response to the second output signal, thereby cutting off the connection between the second clock signal terminal CB1 and the first capacitor C1, so that the potential change of the second clock signal CB1 may not affect the first capacitor C1, and thus the unfavorable coupling of the first capacitor C1 under change of the level of the second clock signal CB1 can be eliminated, and further the effect on the level of the second noise reduction control node PD_ox_i can be eliminated and the power consumption can also be reduced. In the case where the fourth transistor T4 performs noise reduction on the second output terminal OUT, the level (e.g., a low level) of the second output terminal OUT can turn on the third transistor T3, so that the second clock signal CB1 can be transmitted to the first capacitor C1 through the turned-on third transistor T3.

Figure 10:
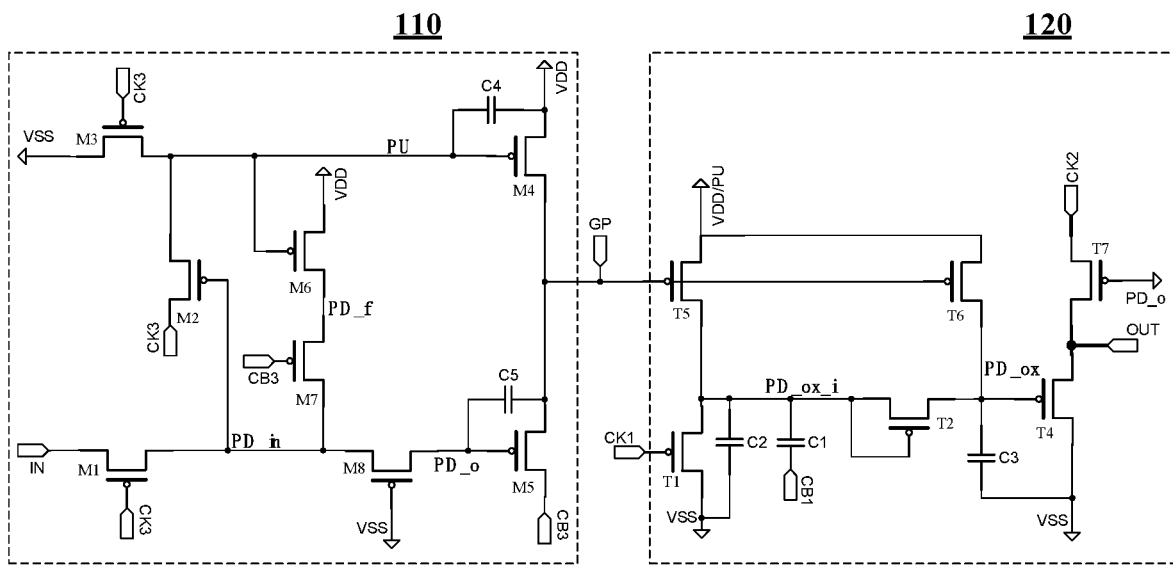
FIG. 10 is a schematic diagram of a circuit structure of a specific implementation example of a shift register unit provided by some embodiments of the present disclosure.

FIG. 10 is a schematic diagram of a circuit structure of a specific implementation example of a shift register unit provided by some embodiments of the present disclosure. As illustrated in FIG. 10, the second shift register circuit module 120 in the shift register unit may be implemented as the second shift register circuit module 120 illustrated in FIG. 8. It should be understood that the second shift register circuit module 120 in the shift register unit illustrated in FIG. 10 may also be implemented as the second shift register circuit module 120 illustrated in FIG. 9, and the embodiments of the present disclosure are not limited in this aspect.

As illustrated in FIG. 10, the first shift register circuit module 110 in the shift register unit may include a first to eighth switch transistors M1~M8, a fourth capacitor C4, and a fifth capacitor C5. A gate electrode of the first switch transistor M1 is connected to the fourth clock signal terminal CK3 to receive the fourth clock signal CK3, a second electrode of the first switch transistor M1 is connected to the input terminal IN, and a first electrode of the first switch transistor M1 is connected to the third node PD_in. A gate electrode of the second switch transistor M2 is connected to the third node PD_in, a second electrode of the second switch transistor M2 is connected to the fourth clock signal terminal CK3 to receive the fourth clock signal CK3, and a first electrode of the second switch transistor M2 is connected to the first node PU. A gate electrode of the third switch transistor M3 is connected to the fourth clock signal terminal CK3 to receive the fourth clock signal CK3, a second electrode of the third switch transistor M3 is connected to the first voltage terminal VSS to receive the first voltage VSS (e.g., the first voltage VSS is at a low level), and a first electrode of the third switch transistor M3 is connected to the first node PU. A gate electrode of the fourth switch transistor M4 is connected to the first node PU, a first electrode of the fourth switch transistor M4 is connected to the second voltage terminal VDD to receive the second voltage VDD (for example, the second voltage VDD is at a high level), and a second electrode of the fourth switch transistor M4 is connected to the first output terminal GP. A first electrode of the fourth capacitor C4 is connected to the first node PU, and a second electrode of the fourth capacitor C4 is connected to the second voltage terminal VDD. A gate electrode of the fifth switch transistor M5 is connected to the second node PD_o, a first electrode of the fifth switch transistor M5 is connected to the fifth clock signal terminal CB3 to receive the fifth clock signal CB3, and a second electrode of the fifth switch transistor M5 is connected to the first output terminal GP. A first electrode of the fifth capacitor C5 is connected to the second node PD_o, and a second electrode of the fifth capacitor C5 is connected to the first output terminal GP. A gate electrode of the sixth switch transistor M6 is connected to the first node PU, a first electrode of the sixth switch transistor M6 is connected to the second voltage terminal VDD to receive the second voltage VDD, and a second electrode of the sixth switch transistor M6 is connected to the fourth node PD_f. A gate electrode of the seventh switch transistor M7 is connected to the fifth clock signal terminal CB3 to receive the fifth clock signal CB3, a first electrode of the seventh switch transistor M7 is connected to the third node PD_in, and a second electrode of the seventh switch transistor M7 is connected to the fourth node PD_f. A gate electrode of the eighth switch transistor M8 is connected to the first voltage terminal VSS to receive the first voltage VSS, a second electrode of the eighth switch transistor M8 is connected to the third node PD_in, and a first electrode of the eighth switch transistor M8 is connected to the second node PD_o.

Figure 12:
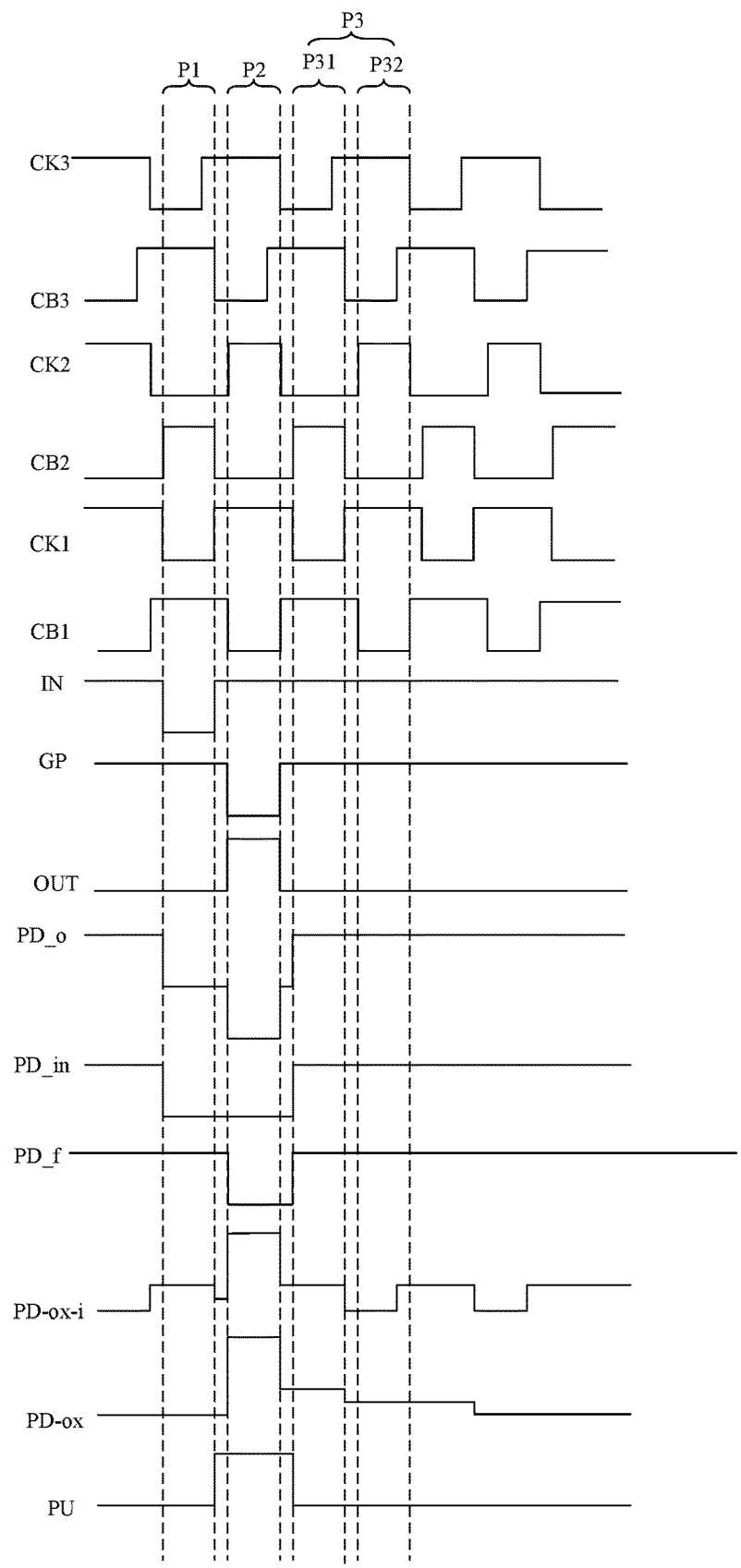
FIG. 12 is a signal timing diagram of the shift register unit illustrated in FIG. 10 in operation.

FIG. 12 is a signal timing diagram of the shift register unit illustrated in FIG. 10 in operation. The working principle of the shift register unit illustrated in FIG. 10 is briefly described below with reference to the signal timing diagram illustrated in FIG. 12. As illustrated in FIG. 12, the working process of the shift register unit illustrated in FIG. 10 includes three phases, namely the first phase P1 (also called the input phase), the second phase P2 (also called the output phase), and the maintaining phase P3 (including the first maintaining phase P31, the second maintaining phase P32, etc.). FIG. 12 shows the timing waveforms of the respective signals in each phase. It should be noted that the potential levels of the signal timing diagram illustrated in FIG. 12 are only schematic and do not represent real potential values or relative proportions. For the embodiments of the present disclosure, the low-level signal corresponds to the turn-on signal of the P-type transistor, and the high-level signal corresponds to the turn-off signal of the P-type transistor.

In the first phase P1, as illustrated in FIG. 12, the first clock signal CK1, the third clock signal CK2, and the fourth clock signal CK3 are at a low level, the second clock signal CBT and the fifth clock signal CB3 are at a high level, and the input terminal IN is at a low level (that is, the input terminal IN receives a low-level input signal), so that the first transistor T1 is turned on, the switch transistors M1 and M3 are turned on, and the switch transistor M7 is turned off. The turned-on switch transistor M1 transmits a low-level input signal to the third node PD_in to allow the level of the third node PD_in to become a low level, so that the switch transistor M2 is turned on. Because the switch transistor M8 is always turned on in response to the first voltage VSS (at a low level), the level of the second node PD_o is the same as the level of the third node PD_in, that is, a low level, so that the low level is stored in the fifth capacitor C5, and the switch transistor M5 is turned on. The turned-on switch transistor M3 transmits the first voltage VSS (at a low level) to the first node PU, and the turned-on switch transistor M2 transmits the low level of the fourth clock signal CK3 to the first node PU, so that the level of the first node PU becomes a low level and is stored in the fourth capacitor C4. The switch transistor M4 is turned on in response to the low level of the first node PU and outputs the second voltage VDD (at a high level) to the first output terminal GP, and at the same time, the switch transistor M5 is turned on in response to the low level of the second node PD_o to transmit the high level of the fifth clock signal CB3 to the first output terminal GP, so that in this phase, the first output terminal GP of the shift register unit outputs a high level, and correspondingly, the fifth transistor T5 and the sixth transistor T6 are turned off in response to the high level of the first output terminal GP. In addition, the turned-on first transistor T1 transmits the first voltage VSS (at a low level) to the second noise reduction control node PD_ox_i, so that the level of the second noise reduction control node PD_ox_i becomes a low level and is stored in the first capacitor C1 and the second capacitor C2. The second transistor T2 is turned on under control of the low level of the second noise reduction control node PD_ox_i, so that the level of the first noise reduction control node PD_ox also becomes a low level and is stored in the third capacitor C3. The fourth transistor T4 is turned on in response to the low level of the first noise reduction control node PD_ox, and the first voltage VSS (at a low level) is transmitted to the second output terminal OUT. The seventh transistor T7 is turned on in response to the low level of the second node PD_o and transmits the low level of the third clock signal CK2 to the second output terminal OUT. Thus, in this phase, the second output terminal OUT of the shift register unit outputs a low level, that is, the noise reduction of the second output terminal OUT is realized.

In the second phase P2, as illustrated in FIG. 12, the first clock signal CK1, the third clock signal CK2, and the fourth clock signal CK3 are at a high level, the second clock signal CB1 and the fifth clock signal CB3 are at a low level, and the input terminal IN is at a high level, so that the first transistor T1 is turned off, the switch transistors M1 and M3 are turned off, and the switch transistor M7 is turned on. Due to the storage function of the fifth capacitor C5, the third node PD_in and the second node PD_o can continue to maintain the low level of the previous phase, so that the switch transistors M2 and M5 are turned on. The turned-on transistor M2 transmits the high level of the fourth clock signal CK3 to the first node PU, so that the level of the first node PU becomes a high level. The switch transistor M4 is turned off in response to the high level of the first node PU, so as to avoid the second voltage VDD (at a high level) from being output to the first output terminal GP. The turned-on switch transistor M5 transmits the low level of the fifth clock signal CB3 to the first output terminal GP, so that in this phase, the first output terminal GP of the shift register unit outputs a low level, that is, outputs the first output signal. For example, the first output signal can be used as the input signal of the next shift register unit and of course can also be used to control the operation of the P-type transistor in the pixel circuit S illustrated in FIG. 1. In addition, the fifth transistor T5 and the sixth transistor T6 are turned on in response to the low level of the first output terminal GP to transmit the second voltage VDD (at a high level) to the second noise reduction control node PD_ox_i and the first noise reduction control node PD_ox, respectively, so that both the level of the second noise reduction control node PD_ox_i and the level of the first noise reduction control node PD_ox become a high level, and correspondingly, the fourth transistor T4 is turned off. The seventh transistor T7 is turned on in response to the low level of the second node PD_o to transmit the high level of the third clock signal CK2 to the second output terminal OUT. Thus, in this phase, the second output terminal OUT of the shift register unit outputs a high level, that is, outputs the second output signal. For example, the second output signal can be used to control the operation of the N-type transistor in the pixel circuit S illustrated in FIG. 1.

In the first maintaining phase P31 of the maintaining phase P3, as illustrated in FIG. 12, the first clock signal CK1, the third clock signal CK2, and the fourth clock signal CK3 are at a low level, the second clock signal CB1 and the fifth clock signal CB3 are at a high level, and the input terminal IN is at a high level, so that the first transistor T1 is turned on, the switch transistors M1 and M3 are turned on, and the switch transistor M7 is turned off. The turned-on switch transistor M1 transmits the high level of the input terminal IN to the third node PD_in and the second node PD_o (the transistor M8 is always turned on), so that the level of the third node PD_in and the level of the second node PD_o become a high level, and correspondingly, the switch transistors M2 and M5 are turned off. The turned-on switch transistor M3 transmits the first voltage VSS (at a low level) to the first node PU, so that the level of the first node PU becomes a low level and is stored in the fourth capacitor C4. The switch transistor M4 is turned on in response to the low level of the first node PU, so as to allow the second voltage VDD (at a high level) to be output to the first output terminal GP, so that in this phase, the first output terminal GP of the shift register unit outputs a high level, and correspondingly, the fifth transistor T5 and the sixth transistor T6 are turned off in response to the high level of the first output terminal GP. In addition, the turned-on first transistor T1 transmits the first voltage VSS (at a low level) to the second noise reduction control node PD_ox_i, so that the level of the second noise reduction control node PD_ox_i becomes a low level and is stored in the first capacitor C1 and the second capacitor C2. The second transistor T2 is turned on under control of the low level of the second noise reduction control node PD_ox_i, so that the level of the first noise reduction control node PD_ox also becomes a low level and is stored in the third capacitor C3. The fourth transistor T4 is turned on in response to the low level of the first noise reduction control node PD_ox, so as to transmit the first voltage VSS (at a low level) to the second output terminal OUT. The seventh transistor T7 is turned off in response to the high level of the second node PD_o. Thus, in this phase, the second output terminal OUT of the shift register unit outputs a low level, that is, the noise reduction of the second output terminal OUT is realized.

In the second maintaining phase P32 of the maintaining phase P3, as illustrated in FIG. 12, the first clock signal CK1, the third clock signal CK2, and the fourth clock signal CK3 are at a high level, the second clock signal CB1 and the fifth clock signal CB3 are at a low level, and the input terminal IN is at a high level, so that the first transistor T1 is turned off, the switch transistors M1 and M3 are turned off, and the switch transistor M7 is turned on. Due to the storage function of the fifth capacitor C5, the third node PD_in and the second node PD_o can continue to maintain the high level of the previous phase, so that the switch transistors M2 and M5 are turned off. Due to the storage function of the fourth capacitor C4, the first node PU can continue to maintain the low level of the previous phase, so that the switch transistors M4 and M6 remain being turned on. The second voltage VDD (at a high level) is transmitted to the third node PD_in and the second node PD_o through the turned-on switch transistor M6 and the turned-on switch transistor M7, so that the third node PD_in and the second node PD_o continue to maintain a high level, thereby effectively preventing the switch transistor M5 from being turned on and further avoiding error output. At the same time, the turned-on switch transistor M4 outputs the second voltage VDD (at a high level) to the first output terminal GP, so that in this phase, the first output terminal GP of the shift register unit outputs a high level, and correspondingly, the fifth transistor T5 and the sixth transistor T6 are turned off in response to the high level of the first output terminal GP. In addition, the second clock signal CB1 changes from a high level to a low level, and due to the bootstrap effect of the first capacitor C1, the level of the second noise reduction control node PD_ox_i in the floating state is further pulled down; and at the same time, due to the coupling effect of the second capacitor C2, the change of the level of the second noise reduction control node PD_ox_i is smaller than the change of the level of the second clock signal CB1, that is, the second capacitor C2 reduces the adjustment magnitude of the first capacitor C1 in case of adjusting the level of the second noise reduction control node PD_ox_i. The second transistor T2 is turned on under control of the low level of the second noise reduction control node PD_ox_i, so that the level of the first noise reduction control node PD_ox is further pulled down. The fourth transistor T4 is turned on in response to the low level of the first noise reduction control node PD_ox and transmits the first voltage VSS (at a low level) to the second output terminal OUT. The seventh transistor T7 is turned off in response to the high level of the second node PD_o. Thus, in this phase, the second output terminal OUT of the shift register unit still outputs a low level, that is, the noise reduction of the second output terminal OUT is continuously realized.

The level change of the second noise reduction control node PD_ox_i and the level change of the first noise reduction control node PD_ox in the maintaining phase P3 is described in detail below. As described above, in the maintaining phase P3, the fifth transistor T5, the sixth transistor T6, and the seventh transistor T7 are always being turned off. Therefore, the level of the second noise reduction control node PD_ox_i and the level of the first noise reduction control node PD_ox are only affected by the first transistor T1, the second transistor T2, the first capacitor C1, the second capacitor C2, and the third capacitor C3, that is, only affected by the second noise reduction control circuit 124.

For example, the influence of the threshold voltage of the first transistor T1 and the threshold voltage of the second transistor T2 is ignored. In the first maintaining phase P31, the first transistor T1 is turned on, the level of the second noise reduction control node PD_ox_i is VSS, the level of the electrode of the first capacitor C1 connected to the second clock signal terminal CB1 is at a high level (may be set to a high level VDD), the second transistor T2 is turned on, and the level of the first noise reduction control node PD_ox is also VSS. In the second maintaining phase P32, the first transistor T1 is turned off, and the level of the electrode of the first capacitor C1 connected to the second clock signal terminal CB1 becomes a low level (may be set to a low level VSS). Due to the bootstrap effect of the first capacitor C1, the level of the second noise reduction control node PD_ox_i changes accordingly, and the change amount is $(VSS-VDD)*C1/C_{PD\_ox\_i}$, where $C_{PD\_ox\_i}=C1+C2+C_{T1}+C_{T2}+C_{T5}$, $C_{PD\_ox\_i}$ represents the total capacitance of respective devices (including the first transistor T1, the second transistor T2, the fifth transistor T5, the first capacitor C1, and the second capacitor C2) connected to the second noise reduction control node PD_ox_i, and $C_{T1}$, $C_{T2}$, $C_{T5}$ respectively represent the parasitic capacitances of the first transistor T1, the second transistor T2, and the fifth transistor T5 related to the second noise reduction control node PD_ox_i. Thus, the level of the second noise reduction control node PD_ox_i is pulled down to $VSS+(VSS-VDD)*C1/C_{PD\_ox\_i}$, and at the same time, because the level of the first noise reduction control node PD_ox is VSS, the second transistor T2 is turned on, and a part of the charges may flow from the first noise reduction control node PD_ox the second noise reduction control node PD_ox_i, that is, the level of the first noise reduction control node PD_ox is pulled down to a certain level greater than $VSS+(VSS-VDD)*C1/C_{PD\_ox\_i}$ and less than VSS. Thereafter, because the first clock signal CK1 and the second clock signal CB1 are alternately at a high level and a low level, in the maintaining phase P3, the first maintaining phase P31 and the second maintaining phase P32 appear alternately. Thus, coupling between the first noise reduction control node PD_ox and the second noise reduction control node PD_ox_i may be performed multiple times until the level of the first noise reduction control node PD_ox is stabilized around $VSS+(VSS-VDD)*C1/C_{PD\_ox\_i}$, so that the fourth transistor T4 is continuously turned on in the maintaining phase P3 to continuously perform noise reduction on the second output terminal OUT. At the same time, by reasonably setting the capacitance values of the first capacitor C1 and the second capacitor C2, the bias effect of the level of the first noise reduction control node PD_ox on the fourth transistor T4 can be reduced, thereby prolonging the service life of the shift register unit 100.

For example, the influence of the threshold voltage of the first transistor T1 and the threshold voltage of the second transistor T2 is considered. In the first maintaining phase P31, the first transistor T1 is turned on, the level of the second noise reduction control node PD_ox_i is VSS+|Vth_T1|, the level of the electrode of the first capacitor C1 connected to the second clock signal terminal CB1 is at a high level (may be set to a high level VDD), the second transistor T2 is turned on, and the level of the first noise reduction control node PD_ox is also VSS+|Vth_T1|+|Vth_T2|, where Vth_T1 represents the threshold voltage of the first transistor T1, and Vth_T2 represents the threshold voltage of the second transistor T2. In the second maintaining phase P31, the first transistor T1 is turned off, and the level of the electrode of the first capacitor C1 connected to the second clock signal terminal CB1 becomes a low level (may be set to a low level VSS). Due to the bootstrap effect of the first capacitor C1, the level of the second noise reduction control node PD_ox_i changes accordingly, and the change amount is (VSS−VDD)*C1/$C_{PD\_ox\_i}$, where $C_{PD\_ox\_i}$=C1+C2+$C_{T1}$+$C_{T2}$+$C_{T5}$, $C_{PD\_ox\_i}$ represents the total capacitance of respective devices (including the first transistor T1, the second transistor T2, the fifth transistor T5, the first capacitor C1, and the second capacitor C2) connected to the second noise reduction control node PD_ox_i, $C_{T1}$, $C_{T2}$, and $C_{T5}$ respectively represent the parasitic capacitances of the first transistor T1, the second transistor T2, and the fifth transistor T5 related to the second noise reduction control node PD_ox_i. Thus, the level of the second noise reduction control node PD_ox_i is pulled down to VSS+|Vth_T1|+(VSS−VDD)*C1/$C_{PD\_ox\_i}$, and at the same time, because the level of the first noise reduction control node PD_ox is VSS+|Vth_T1|+|Vth_T2|, the second transistor T2 is turned on, and a part of the charges may flow from the first noise reduction control node PD_ox to the second noise reduction control node PD_ox_i, that is, the level of the first noise reduction control node is pulled down to a certain level less than VSS+|Vth_T1|+|Vth_T2| and greater than VSS+|Vth_T1|+(VSS−VDD)*C1/$C_{PD\_ox\_i}$. Thereafter, because the first clock signal CK1 and the second clock signal CB1 are alternately at a high level and a low level, in the maintaining phase P3, the first maintaining phase P31 and the second maintaining phase P32 appear alternately. Thus, coupling between the first noise reduction control node PD_ox and the second noise reduction control node PD_ox_i may be performed multiple times until the level of the first noise reduction control node PD_ox is stabilized around VSS+|Vth_T1|+|Vth_T2| (VSS−VDD)*C1/$C_{PD\_ox\_i}$, so that the fourth transistor T4 is continuously turned on in the maintaining phase P3 to continuously perform noise reduction on the second output terminal OUT. At the same time, by reasonably setting the capacitance values of the first capacitor C1 and the second capacitor C2, the bias effect of the level of the first noise reduction control node PD_ox on the fourth transistor T4 can be reduced, thereby prolonging the service life of the shift register unit 100.

It should be understood that the timing waveforms of the respective clock signals illustrated in FIG. 12 are schematic. For example, in some embodiments, the first clock signal CK1 and the fourth clock signal CK3 may be the same, and the second clock signal CB1 and the fifth clock signal CB3 may be the same. In this case, the first clock signal terminal CK1 may be further used as the fourth clock signal terminal CK3, and the second clock signal terminal CB1 may be further used as the fifth clock signal terminal CB3. It should be noted that the embodiments of the present disclosure are not limited in this aspect.

Figure 11:
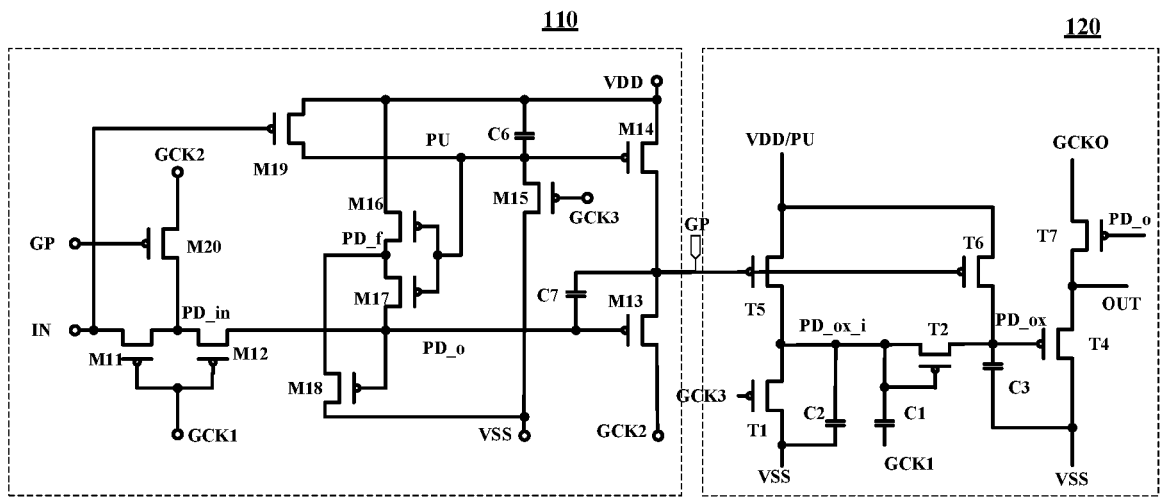
FIG. 11 is a schematic diagram of a circuit structure of another specific implementation example of a shift register unit provided by some embodiments of the present disclosure.

FIG. 11 is a schematic diagram of a circuit structure of another specific implementation example of a shift register unit provided by some embodiments of the present disclosure. As illustrated in FIG. 11, the second shift register circuit module 120 in the shift register unit may be implemented as the second shift register circuit module 120 illustrated in FIG. 8. In this case, the clock signal terminals GCK3, GCK1 and GCK0 in FIG. 11 respectively correspond to the first clock signal terminal CK1, the second clock signal terminal CB1, and the third clock signal terminal CK2 in FIG. 8, that is, the clock signal terminal GCK3 is the first clock signal terminal, the clock signal terminal GCK1 is the second clock signal terminal, and the clock signal terminal GCK0 is the third clock signal terminal. It should be understood that the second shift register circuit module 120 in the shift register unit illustrated in FIG. 11 may also be implemented as the second shift register circuit module 120 illustrated in FIG. 9. The embodiments of the present disclosure are not limited in this aspect.

As illustrated in FIG. 11, the first shift register circuit module 110 in the shift register unit may include eleventh to twentieth switch transistors M11~M20, a sixth capacitor C6, and a seventh capacitor C7. A gate electrode of the eleventh switch transistor M11 is connected to the second clock signal terminal GCK1 to receive the second clock signal GCK1, a second electrode of the eleventh switch transistor M11 is connected to the input terminal IN to receive the input signal, and a first electrode of the eleventh switch transistor M11 is connected to the third node PD_in. A gate electrode of the twelfth switch transistor M2 is connected to the second clock signal terminal GCK1 to receive the second clock signal GCK1, a second electrode of the twelfth switch transistor M12 is connected to the third node PD_in, and a first electrode of the twelfth switch transistor M12 connected to the second node PD_o. A gate electrode of the thirteenth switch transistor M13 is connected to the second node PD_o, a first electrode of the thirteenth switch transistor M13 is connected to the sixth clock signal terminal GCK2 to receive the sixth clock signal GCK2, and a second electrode of the thirteenth switch transistor M13 is connected to the first output terminal GP. A first electrode of the seventh capacitor C7 is connected to the second node PD_o, and a second electrode of the seventh capacitor C7 is connected to the first output terminal GP. A gate electrode of the fourteenth switch transistor M14 is connected to the first node PU, a first electrode of the fourteenth switch transistor M14 is connected to the second voltage terminal VDD to receive the second voltage VDD (for example, the second voltage VDD is at a high level), and a second electrode of the fourteenth switch transistor M14 is connected to the first output terminal GP. A first electrode of the sixth capacitor C6 is connected to the first node PU, and a second electrode of the sixth capacitor C6 is connected to the second voltage terminal VDD. A gate electrode of the fifteenth switch transistor M15 is connected to the first clock signal terminal GCK3 to receive the first clock signal, a first electrode of the fifteenth switch transistor M15 is connected to the first node PU, and a second electrode of the fifteenth switch transistor M15 is connected to the first voltage terminal VSS to receive the first voltage VSS (e.g., the first voltage VSS is at a low level). A gate electrode of the sixteenth switch transistor M16 is connected to the first node PU, a first electrode of the sixteenth switch transistor M16 is connected to the second voltage terminal VDD to receive the second voltage VDD, and a second electrode of the sixteenth switch transistor M16 is connected to the fourth node PD_f. A gate electrode of the seventeenth switch transistor M17 is connected to the first node PU, a first electrode of the seventeenth switch transistor M17 is connected to the fourth node PD_f, and a second electrode of the seventeenth switch transistor M17 is connected to the second node PD_o. A gate electrode of the eighteenth switch transistor M18 is connected to the second node PD_o, a first electrode of the eighteenth switch transistor M18 is connected to the fourth node PD_f, and a second electrode of the eighteenth switch transistor M18 is connected to the first voltage terminal VSS to receive the first voltage VSS. A gate electrode of the nineteenth switch transistor M19 is connected to the input terminal IN to receive the input signal, a first electrode of the nineteenth switch transistor M19 is connected to the second voltage terminal VDD to receive the second voltage VDD, and a second electrode of the nineteenth switch transistor M19 is connected to the first node PU. A gate electrode of the twentieth switch transistor M20 is connected to the first output terminal GP to receive the first output signal, a first electrode of the twentieth switch transistor M20 is connected to the sixth clock signal terminal GCK2 to receive the second clock signal GCK2, and a second electrode of the twentieth switch transistor M20 is connected to the third node PD_in.

Figure 13:
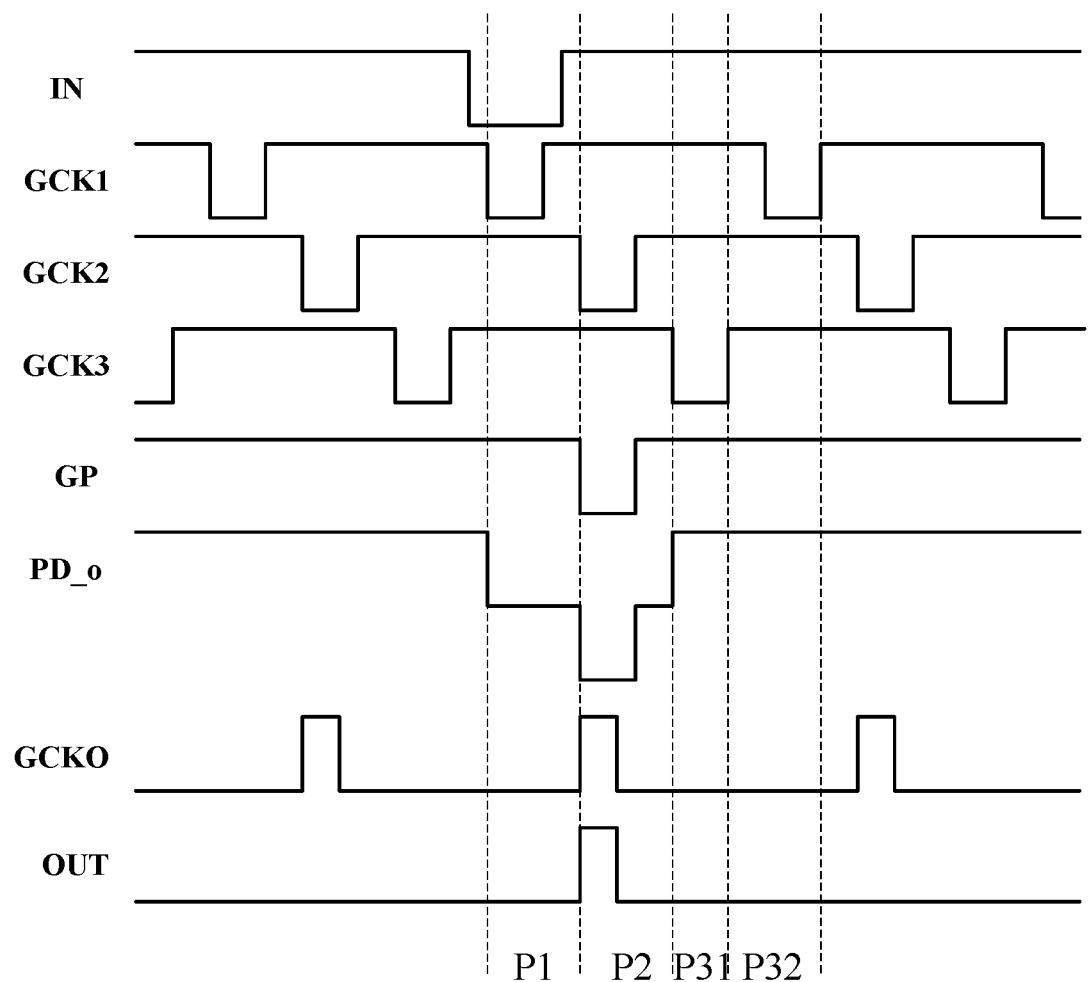
FIG. 13 is a signal timing diagram of the shift register unit illustrated in FIG. 11 in operation.

FIG. 13 is a signal timing diagram of the shift register unit illustrated in FIG. 11 in operation. The working principle of the shift register unit illustrated in FIG. 11 is briefly described below with reference to the signal timing diagram illustrated in FIG. 13. As illustrated in FIG. 13, the working process of the shift register unit illustrated in FIG. 11 includes three phases, namely the first phase P1 (also called the input phase), the second phase P2 (also called the output phase), and the maintaining phase including the first maintaining phase P31, the second maintaining phase P32, etc. FIG. 13 shows the timing waveforms of the respective signals in each phase. It should be noted that the potential level in the signal timing diagram illustrated in FIG. 13 is only schematic and does not represent the actual potential value or relative ratio. For the embodiments of the present disclosure, the low-level signal corresponds to the turn-on signal of the P-type transistor, and the high-level signal corresponds to the turn-off signal of the P-type transistor.

In the first phase P1, as illustrated in FIG. 13, the first clock signal GCK3 is at a high level, the second clock signal GCK1 is at a low level, the third clock signal GCKO is at a low level, the sixth clock signal GCK2 is at a high level, and the input terminal IN is at a low level (i.e., the input terminal IN receives a low-level input signal), so that the first transistor T1 is turned off, the switch transistors M11, M12, and M19 are turned on, and the switch transistor M15 is turned off. The turned-on switch transistor M19 transmits the second voltage VDD (at a high level) to the first node PU, so that the level of the first node PU becomes a high level and is stored in the sixth capacitor C6, and accordingly, the switch transistors M14, M16, and M17 are turned off. The turned-on switch transistors M11 and M12 transmit the low-level input signal IN to the second node PD_o, so that the level of the second node PD_o becomes a low level and is stored in the seventh capacitor C7. The switch transistor M13 is turned on in response to the low level of the second node PD_o and transmits the high level of the sixth clock signal GCK2 to the first output terminal GP, so that in this phase, the first output terminal GP of the shift register unit outputs a high level, and correspondingly, the switch transistor M20, the fifth transistor T5, and the sixth transistor T6 are turned off in response to the high level of the first output terminal GP. In addition, the seventh transistor M7 is turned on in response to the low level of the second node PD_o and transmits the low level of the third clock signal GCKO to the second output terminal OUT. Thus, in this phase, the second output terminal OUT of the shift register unit outputs a low level, that is, the noise reduction of the second output terminal OUT is achieved.

In the second phase P2, as illustrated in FIG. 13, the first clock signal GCK3 is at a high level, the second clock signal GCK1 is at a high level, the third clock signal GCKO is at a high level, the sixth clock signal GCK2 is at a low level, and the input terminal IN is at a high level, so that the first transistor T1 is turned off, and the switch transistors M11, M12, M15, and M19 are turned off. Due to the storage function of the sixth capacitor C6, the first node PU can continue to maintain the high level of the previous phase, so that the switch transistors M14, M16, and M17 are still turned off. Due to the storage function of the seventh capacitor C7, the second node PD_o can continue to maintain the low level of the previous phase, so that the switch transistor M13 is still turned on. The turned-on switch transistor M13 transmits the low level of the sixth clock signal GCK2 to the first output terminal GP, so that, in this phase, the first output terminal GP of the shift register unit outputs a low level, that is, the first output signal is output. For example, the first output signal can be used as the input signal of the next shift register unit, and of course, can also be used to control the operation of the P-type transistor in the pixel circuit S as illustrated in FIG. 1. The switch transistor M20 is turned on in response to the low level (i.e., the first output signal) of the first output terminal GP and transmits the low level of the sixth clock signal GCK2 to the third node PD_in, so that the leakage of the second node PD_o can be reduced. In addition, the fifth transistor T5 and the sixth transistor T6 are turned on in response to the low level of the first output terminal GP and transmit the second voltage VDD (at a high level) to the second noise reduction control node PD_ox_i and the first noise reduction control node PD_ox, respectively, so that the levels of the second noise reduction control node PD_ox_i and the first noise reduction control node PD_ox become a high level, and correspondingly, the fourth transistor T4 is turned off. The seventh transistor T7 is still turned on under control of the low level of the second node PD_o and transmits the high level of the third clock signal GCKO to the second output terminal OUT. Thus, in this phase, the second output terminal OUT of the shift register unit outputs a high level, that is, the second output signal is output. For example, the second output signal can be used to control the operation of the N-type transistor in the pixel circuit S illustrated in FIG. 1. For example, as illustrated in FIG. 13, the pulse width of the high pulse of the third clock signal GCKO is smaller than the pulse width of the low pulse of the clock signal GCK1/2/3, and therefore, the pulse (including the rising edge and the falling edge) of the third clock signal GCKO can be all transmitted to the second output terminal OUT.

In the first maintaining phase P31 of the maintaining phase, as illustrated in FIG. 13, the first clock signal GCK3 is at a low level, the second clock signal GCK1 is at a high level, the third clock signal GCKO is at a low level, the sixth clock signal GCK2 is at a high level, and the input terminal IN is at a high level, so that the first transistor T1 is turned on, the switch transistors M11, M12, and M19 are turned off, and the switch transistor M15 is turned on. The turned-on switch transistor M15 transmits the first voltage VSS (at a low level) to the first node PU, so that the level of the first node PU becomes a low level and is stored in the sixth capacitor C6, and correspondingly, the switch transistors M14, M16, and M17 are turned on. The turned-on switch transistors M16 and M17 transmit the second voltage VDD (at a high level) to the second node PD_o, so that the level of the second node PD_o becomes a high level and is stored in the seventh capacitor C7, and correspondingly, the switch transistor M13 is turned off. The turned-on switch transistor M14 outputs the second voltage VDD (at a high level) to the first output terminal GP, so that in this phase, the first output terminal GP of the shift register unit outputs a high level, and accordingly, the switch transistor M20, the fifth transistor T5, and the sixth transistor T6 are turned off in response to the high level of the first output terminal GP. In addition, the turned-on first transistor T1 transmits the first voltage VSS (at a low level) to the second noise reduction control node PD_ox_i, so that the level of the second noise reduction control node PD_ox_i becomes a low level and is stored in the first capacitor C1 and the second capacitor C2. The second transistor T2 is turned on under control of the low level of the second noise reduction control node PD_ox_i, so that the level of the first noise reduction control node PD_ox also becomes a low level and is stored in the third capacitor C3. The fourth transistor T4 is turned on in response to the low level of the first noise reduction control node PD_ox and transmits the first voltage VSS (at a low level) to the second output terminal OUT. The seventh transistor T7 is turned off in response to the high level of the second node PD_o. Thus, in this phase, the second output terminal OUT of the shift register unit outputs a low level, that is, the noise reduction of the second output terminal OUT is implemented.

In the second maintaining phase P32 of the maintaining phase, as illustrated in FIG. 13, the first clock signal GCK3 is at a high level, the second clock signal GCK1 is at a low level, the third clock signal GCK0 is at a low level, the sixth clock signal GCK2 is at a high level, and the input terminal IN is at a high level, so that the first transistor T1 is turned on, and the switch transistors M11, M12, M15, and M19 are turned off. Due to the storage function of the sixth capacitor C6, the first node PU can continue to maintain the low level of the previous phase, and correspondingly, the switch transistors M14, M16, and M17 remain being turned on. The turned-on switch transistors M16 and M17 transmit the second voltage VDD (at a high level) to the second node PD_o, so that the level of the second node PD_o remains a high level, and accordingly, the switch transistor M13 is turned off. The turned-on switch transistor M14 outputs the second voltage VDD (at a high level) to the first output terminal GP, so that in this phase, the first output terminal GP of the shift register unit outputs a high level, and correspondingly, the switch transistor M20, the fifth transistor T5, and the sixth transistor T6 are turned off in response to the high level of the first output terminal GP. In addition, the second clock signal GCK1 changes from a high level to a low level, and due to the bootstrap effect of the first capacitor C1, the level of the second noise reduction control node PD_ox_i in the floating state is further pulled down, and at the same time, due to the coupling effect of the second capacitor C2, the level change of the second noise reduction control node PD_ox_i is smaller than the level change of the second clock signal GCK1, that is, the second capacitor C2 reduces the adjustment magnitude of the first capacitor C1 in case of adjusting the level of the second noise reduction control node PD_ox_i. The second transistor T2 turned on under control of the low level of the second noise reduction control node PD_ox_i, so that the level of the first noise reduction control node PD_ox is further pulled down. The fourth transistor T4 is turned on in response to the low level of the first noise reduction control node PD_ox and transmits the first voltage VSS (at a low level) to the second output terminal OUT. The seventh transistor T7 is turned off in response to the high level of the second node PD_o. Thus, in this phase, the second output terminal OUT of the shift register unit still outputs a low level, that is, the noise reduction of the second output terminal OUT is continuously implemented.

As mentioned above, in the maintaining phase P3, the level of the first node PU is kept at a low level, the level of the second node PD_o is kept at a high level, and correspondingly, the first output terminal GP keeps outputting a high level, and the fifth transistor T5, the sixth transistor T6, and the seventh transistor T7 are always being turned off. Therefore, the level of the second noise reduction control node PD_ox_i and the level of the first noise reduction control node PD_ox are only affected by the first transistor T1, the second transistor T2, the first capacitor C1, the second capacitor C2, and the third capacitor C3, that is, only affected by the second noise reduction control circuit 124. Therefore, the level change of the second noise reduction control node PD_ox_i and the level change of the first noise reduction control node PD_ox in the maintaining phase P3 of the shift register unit illustrated in FIG. 11 may refer to the related descriptions of the level change of the second noise reduction control node PD_ox_i and the level change of the first noise reduction control node PD_ox in the maintaining phase P3 of the shift register unit illustrated in FIG. 10, and details are not repeated here.

It should be understood that the timing waveform of respective clock signal illustrated in FIG. 13 is schematic and is not limited by the embodiments of the present disclosure.

It should be noted that, the first shift register circuit module 110 in the shift register unit 100 provided by the embodiments of the present disclosure is not limited to the circuit structure of the first shift register circuit module 110 illustrated in FIG. 10 and FIG. 11, as long as the first output signal is output at the first output terminal GP according to the input signal received by the input terminal and the turn-on control signal is provided to the second shift register circuit module 120, and the embodiments of the present disclosure are not limited in this aspect.

It should be noted that the "active level" of the shift register unit provided by the embodiments of the present disclosure refers to a level that enables the operated transistor included in the shift register unit to be turned on, and correspondingly, the "invalid level" refers to a level that cannot enable the operated transistor included in the shift register unit to be turned on (i.e., the operated transistor is turned off). The active level may be higher or lower than the invalid level depending on factors such as the type (N-type or P-type) of the transistor in the circuit structure of the shift register unit. For example, in the embodiments of the present disclosure, when each transistor is a P-type transistor, the active level is a low level, and the invalid level is a high level.

It should be noted that, in the embodiments of the present disclosure, the capacitor may be a capacitor device fabricated through a process, for example, a capacitor device may be realized by fabricating a special capacitor electrode, and each electrode of the capacitor may be made of a metal layer, a semiconductor layer (e.g., doped polysilicon), or the like. Also, the capacitor may also be a parasitic capacitor between various devices, which can be realized by the transistor itself and other devices, lines, etc. The connection method of the capacitor is not limited to the method described above, and other applicable connection methods are also possible, as long as the level of the corresponding node can be stored.

It should be noted that, in the description of each embodiment of the present disclosure, each node does not represent an actual component, but represents a junction of related electrical connection in a circuit diagram.

It should be noted that the transistors used in the embodiments of the present disclosure may all be thin film transistors, field effect transistors, or other switch devices with the same characteristics, and the thin film transistors are used as examples for description in the embodiments of the present disclosure. The source electrode and drain electrode of the transistor used here may be symmetrical in structure, so the source electrode and drain electrode of the transistor may be indistinguishable in structure. In the embodiments of the present disclosure, in order to distinguish the two electrodes of the transistor except for the gate electrode, one electrode is directly described as the first electrode, and the other electrode is directly described as the second electrode.

In addition, the transistors in the embodiments of the present disclosure are all described by taking a P-type transistor as an example. In this case, the first electrode of the transistor is the source electrode, and the second electrode is the drain electrode. It should be noted that the present disclosure includes but is not limited to this. For example, one or more transistors in the shift register unit 100 provided by the embodiments of the present disclosure may also adopt an N-type transistor. In this case, the first electrode of the transistor is the drain electrode, and the second electrode is the source electrode. Each electrode of a transistor of a certain type is connected correspondingly with reference to each electrode of the corresponding transistor in the embodiments of the present disclosure, and the corresponding high voltage or low voltage may be provided at the corresponding voltage terminal. When an N-type transistor is used, indium gallium zinc oxide (IGZO) can be used as the active layer of the thin film transistor, which can effectively reduce the size of the transistor and prevent the leakage current compared to using low temperature poly silicon (LTPS) or amorphous silicon (such as hydrogenated non-crystalline silicon) as the active layer of the thin film transistor.

In the shift register unit provided by some embodiments of the present disclosure, by providing the second noise reduction control circuit with a charge pump structure formed by the first control circuit, the first coupling circuit, the second coupling circuit, the transmission circuit, and the storage circuit, the adjustment effect of the charge pump structure on the voltage can be used to adjust the level of the first noise reduction control node. Thus, in one aspect, it ensures that the noise reduction circuit is continuously turned on in the maintaining phase to remove noise interference in time, and in another aspect, the biasing effect of the level of the first noise reduction control node on the noise reduction circuit can be reduced, thereby prolonging the service life of the shift register unit.

At least one embodiment of the present disclosure further provides a gate driving circuit. For example, referring to FIG. 1, the gate driving circuit includes a plurality of cascaded shift register units RS (as illustrated by RS_1, RS_2, . . . , RS_N). Any one or more shift register units RS may adopt the structure of the shift register unit 100 provided by any one of the embodiments of the present disclosure or a modification thereof. For example, the shift register unit 100 illustrated in FIG. 10 or FIG. 11 may be adopted.

For example, the gate driving circuit can be directly integrated on the array substrate of the display device using the same semiconductor manufacturing process as the thin film transistor, so as to realize the progressive or interlaced scanning driving function. For example, as illustrated in FIG. 1, in the gate driving circuit, except for the first shift register unit, the input terminal IN of any other shift register unit is connected to the first output terminal GP of the previous shift register unit. For example, as illustrated in FIG. 1, the input terminal IN of the first shift register unit may be configured to receive the trigger signal STV. For example, the working principle of each shift register unit in the gate driving circuit may be referred to the corresponding description of the working principle of the shift register unit provided by the embodiments of the present disclosure, and details are not repeated here. For example, more details of the gate driving circuit may be referred to the foregoing description of FIG. 1, which will not be repeated here.

The technical effect of the gate driving circuit provided by the embodiments of the present disclosure may be referred to the corresponding description of the shift register unit 100 in the above-mentioned embodiments, and details are not repeated here.

At least one embodiment of the present disclosure further provides a display device. For example, as illustrated in FIG. 1, the display device may include the gate driving circuit provided by any one of the embodiments of the present disclosure. For example, as illustrated in FIG. 1, the display device may further include a display panel 01, the display panel 01 includes a plurality of sub-pixels P arranged in an array, and each sub-pixel P includes a pixel circuit S. For example, referring to FIG. 1, the display panel 01 further includes a plurality of gate lines GL (as illustrated by G_1, G_2, . . . , G_N in FIG. 1, where N is a positive integer). The second output terminal OUT of each shift register unit RS in the gate driving circuit is connected to at least one gate line of the plurality of gate lines GL, so as to respectively provide a scanning signal to the pixel circuits S of the corresponding row.

For example, as illustrated in FIG. 1, the display device may further include a data driving circuit. The data driving circuit is connected to the pixel circuit S through the data lines DL (illustrated by D_1, D_2, . . . , D_M in FIG. 1, where M is a positive integer) for providing data signals to the pixel array.

It should be noted that the display device in this embodiment may be any product or component with a display function, such as a display, an OLED panel, an OLED TV, an electronic paper display device, a mobile phone, a tablet computer, a notebook computer, a digital photo frame, a navigator, etc. The embodiments of the present disclosure do not limit this.

It should be noted that, for the sake of clarity and conciseness, the entire structure of the display device 1 is not given. In order to realize the necessary functions of the display device, those skilled in the art may set other structures not illustrated according to specific application scenarios, which are not limited in the embodiments of the present disclosure.

The technical effect of the display device provided by the embodiments of the present disclosure may be referred to the corresponding description of the gate driving circuit in the above-mentioned embodiments, which will not be repeated here.

At least one embodiment of the present disclosure further provides a method for driving a shift register unit, which can be used to drive the shift register unit 100 provided by the embodiments of the present disclosure. For example, the method includes a maintaining phase; and in the maintaining phase, the first clock signal CK1 and the second clock signal CB1 are input alternately, and the level of the first noise reduction control node PD_ox is adjusted through the second noise reduction control circuit 124, so as to turn on the noise reduction circuit 122 to allow the noise reduction circuit 122 to perform noise reduction on the second output terminal OUT. For example, the specific details of the method may be referred to the related description of the working principle of the shift register unit illustrated in FIG. 10 and FIG. 11, which will not be repeated here.

The technical effect of the method for driving the shift register unit provided by the embodiments of the present disclosure may be referred to the corresponding description of the shift register unit 100 in the above-mentioned embodiments, which will not be repeated here.

For the present disclosure, the following statements should be noted.

(1) The accompanying drawings related to the embodiment(s) of the present disclosure involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale.

(3) In case of no conflict, features in one embodiment or in different embodiments can be combined to obtain new embodiments.

What have been described above merely are specific implementations of the present disclosure, and the protection scope of the present disclosure is not limited thereto. The protection scope of the present disclosure should be based on the protection scope of the claims.

What is claimed is:

1. A shift register unit, comprising: a first shift register circuit module and a second shift register circuit module,
   wherein the first shift register circuit module is configured to output a first output signal at a first output terminal according to an input signal received by an input terminal and is configured to provide a turn-on control signal to the second shift register circuit module; and
   the second shift register circuit module comprises an output circuit, a noise reduction circuit, a first noise reduction control circuit, and a second noise reduction control circuit, the output circuit is configured to output a second output signal at a second output terminal in response to the turn-on control signal,
   the noise reduction circuit is configured to perform noise reduction on the second output terminal under control of a level of a first noise reduction control node,
   the first noise reduction control circuit is configured to control the level of the first noise reduction control node to turn off the noise reduction circuit in response to the first output signal, and
   the second noise reduction control circuit is configured to adjust the level of the first noise reduction control node to turn on the noise reduction circuit under control of a first clock signal and a second clock signal,
   wherein the second noise reduction control circuit comprises a first control circuit, a first coupling circuit, a second coupling circuit, a transmission circuit, and a storage circuit, the first control circuit is configured to transmit a first voltage to a second noise reduction control node under control of the first clock signal,
   the first coupling circuit is configured to store a level of the second noise reduction control node and adjust the level of the second noise reduction control node under control of the second clock signal,
   the second coupling circuit is configured to store the level of the second noise reduction control node and reduce an adjustment magnitude of the first coupling circuit in case of adjusting the level of the second noise reduction control node,
   the transmission circuit is configured to connect the first noise reduction control node and the second noise reduction control node to balance the level of the first noise reduction control node and the level of the second noise reduction control node, and
   the storage circuit is configured to store the level of the first noise reduction control node.

2. The shift register unit according to claim 1, wherein the first control circuit comprises a first transistor, the first coupling circuit comprises a first capacitor, the second coupling circuit comprises a second capacitor, the transmission circuit comprises a second transistor, and the storage circuit comprises a third capacitor;
   a gate electrode of the first transistor is connected to a first clock signal terminal to receive the first clock signal, a first electrode of the first transistor is connected to a first voltage terminal to receive the first voltage, and a second electrode of the first transistor is connected to the second noise reduction control node;
   a first electrode of the first capacitor is connected to the second noise reduction control node, and a second electrode of the first capacitor is connected to a second clock signal terminal receive the second clock signal;
   a first electrode of the second capacitor is connected to the second noise reduction control node, and a second electrode of the second capacitor is connected to the first voltage terminal;
   a gate electrode of the second transistor is connected to the second noise reduction control node, a first electrode of the second transistor is connected to the first noise reduction control node, and a second electrode of the second transistor is connected to the second noise reduction control node; and
   a first electrode of the third capacitor is connected to the first noise reduction control node, and a second electrode of the third capacitor is connected to the first voltage terminal.

3. The shift register unit according to claim 2, wherein the second noise reduction control circuit further comprises a second control circuit, and
   the second control circuit is configured to transmit the second clock signal to the first coupling circuit under control of a level of the second output terminal.

4. The shift register unit according to claim 3, wherein the second control circuit comprises a third transistor, and the second electrode of the first capacitor is connected to the second clock signal terminal through the third transistor; and
   a gate electrode of the third transistor is connected to the second output terminal, a first electrode of the third transistor is connected to the second clock signal terminal, and a second electrode of the third transistor is connected to the second electrode of the first capacitor.

5. A gate driving circuit, comprising a plurality of shift register units, which are cascaded, according to claim 2.

6. The shift register unit according to claim 1, wherein the noise reduction circuit is configured to transmit the first voltage to the second output terminal under control of the level of the first noise reduction control node, so as to perform noise reduction on the second output terminal.

7. The shift register unit according to claim 6, wherein the noise reduction circuit comprises a fourth transistor,
a gate electrode of the fourth transistor is connected to the first noise reduction control node, a first electrode of the fourth transistor is connected to a first voltage terminal to receive the first voltage, and a second electrode of the fourth transistor is connected to the first output terminal.

8. The shift register unit according to claim 6, wherein under regulation of the second noise reduction control circuit, a difference between the level of the first noise reduction control node and the first voltage is n times a threshold voltage of the noise reduction circuit, where 1≤n≤10.

9. The shift register unit according to claim 1, wherein the first noise reduction control circuit is further configured to control the level of the second noise reduction control node in response to the first output signal.

10. The shift register unit according to claim 9, wherein the first noise reduction control circuit comprises a fifth transistor and a sixth transistor;
a gate electrode of the fifth transistor is connected to the first output terminal to receive the first output signal, a first electrode of the fifth transistor is connected to a first signal terminal to receive a first signal level, and a second electrode of the fifth transistor is connected to the first noise reduction control node; and
a gate electrode of the sixth transistor is connected to the first output terminal to receive the first output signal, a first electrode of the sixth transistor is connected to the first signal terminal to receive the first signal level, and a second electrode of the sixth transistor is connected to the second noise reduction control node.

11. The shift register unit according to claim 10, wherein the first signal terminal is a second voltage terminal for providing a second voltage, and the first signal level is the second voltage; or
the first signal terminal is connected to a first node in the first shift register circuit module, and
the first signal level is a level of the first node.

12. The shift register unit according to claim 1, wherein the output circuit comprises a seventh transistor,
a gate electrode of the seventh transistor is connected to a second signal terminal to receive the turn-on control signal, a first electrode of the seventh transistor is connected to a third clock signal terminal to receive a third clock signal, and a second electrode of the seventh transistor connected to the second output terminal.

13. The shift register unit according to claim 12, wherein the second signal terminal connected to a second node in the first shift register circuit module.

14. The shift register unit according to claim 1, wherein the first shift register circuit module comprises: a first switch transistor, a second switch transistor, a third switch transistor, a fourth switch transistor, a fifth switch transistor, a sixth switch transistor, a seventh switch transistor, an eighth switch transistor, a fourth capacitor, and a fifth capacitor;
a gate electrode of the first switch transistor is connected to a fourth clock signal terminal to receive a fourth clock signal, a first electrode of the first switch transistor is connected to a third node, and a second electrode of the first switch transistor is connected to the input terminal;
a gate electrode of the second switch transistor is connected to the third node, a first electrode of the second switch transistor is connected to a first node, and a second electrode of the second switch transistor is connected to the fourth clock signal terminal to receive the fourth clock signal;
a gate electrode of the third switch transistor is connected to the fourth clock signal terminal to receive the fourth clock signal, a first electrode of the third switch transistor is connected to the first node, and a second electrode of the third switch transistor is connected to a first voltage terminal to receive the first voltage;
a gate electrode of the fourth switch transistor is connected to the first node, a first electrode of the fourth switch transistor is connected to a second voltage terminal to receive a second voltage, and a second electrode of the fourth switch transistor is connected to the first output terminal;
a first electrode of the fourth capacitor is connected to the first node, and a second electrode of the fourth capacitor is connected to the second voltage terminal;
a gate electrode of the fifth switch transistor is connected to a second node, a first electrode of the fifth switch transistor is connected to a fifth clock signal terminal to receive a fifth clock signal, and a second electrode of the fifth switch transistor is connected to the first output terminal;
a first electrode of the fifth capacitor is connected to the second node, and a second electrode of the fifth capacitor is connected to the first output terminal;
a gate electrode of the sixth switch transistor is connected to the first node, a first electrode of the sixth switch transistor is connected to the second voltage terminal to receive the second voltage, and a second electrode of the sixth switch transistor is connected to a fourth node;
a gate electrode of the seventh switch transistor is connected to the fifth clock signal terminal to receive the fifth clock signal, a first electrode of the seventh switch transistor is connected to the third node, and a second electrode of the seventh switch transistor is connected to the fourth node; and
a gate electrode of the eighth switch transistor is connected to the first voltage terminal to receive the first voltage, a first electrode of the eighth switch transistor is connected to the second node, and a second electrode of the eighth switch transistor is connected to the third node.

15. The shift register unit according to claim 1, wherein the first shift register circuit module comprises: an eleventh switch transistor, a twelfth switch transistor, a thirteenth switch transistor, a fourteenth switch transistor, a fifteenth switch transistor, a sixteenth switch transistor, a seventeenth switch transistor, an eighteenth switch transistor, a nineteenth switch transistor, a twentieth switch transistor, a sixth capacitor, and a seventh capacitor;
a gate electrode of the eleventh switch transistor is connected to a second clock signal terminal to receive the second clock signal, a second electrode of the eleventh switch transistor is connected to the input terminal to receive the input signal, and a first electrode of the eleventh switch transistor is connected to a third node;
a gate electrode of the twelfth switch transistor is connected to the second clock signal terminal to receive the second clock signal, a second electrode of the twelfth switch transistor is connected to the third node, and a first electrode of the twelfth switch transistor is connected to a second node;

a gate electrode of the thirteenth switch transistor is connected to the second node, a first electrode of the thirteenth switch transistor is connected to a sixth clock signal terminal to receive a sixth clock signal, and a second electrode of the thirteenth switch transistor is connected to the first output terminal;

a first electrode of the seventh capacitor is connected to the second node, and a second electrode of the seventh capacitor is connected to the first output terminal;

a gate electrode of the fourteenth switch transistor is connected to a first node, a first electrode of the fourteenth switch transistor is connected to a second voltage terminal to receive a second voltage, and a second electrode of the fourteenth switch transistor is connected to the first output terminal;

a first electrode of the sixth capacitor is connected to the first node, and a second electrode of the sixth capacitor is connected to the second voltage terminal;

a gate electrode of the fifteenth switch transistor is connected to a first clock signal terminal to receive the first clock signal, a first electrode of the fifteenth switch transistor is connected to the first node, and a second electrode of the fifteenth switch transistor is connected to a first voltage terminal to receive the first voltage;

a gate electrode of the sixteenth switch transistor is connected to the first node, a first electrode of the sixteenth switch transistor is connected to the second voltage terminal to receive the second voltage, and a second electrode of the sixteenth switch transistor is connected to a fourth node;

a gate electrode of the seventeenth switch transistor is connected to the first node, a first electrode of the seventeenth switch transistor is connected to the fourth node, and a second electrode of the seventeenth switch transistor is connected to the second node;

a gate electrode of the eighteenth switch transistor is connected to the second node, a first electrode of the eighteenth switch transistor is connected to the fourth node, and a second electrode of the eighteenth switch transistor is connected to the first voltage terminal to receive the first voltage;

a gate electrode of the nineteenth switch transistor is connected to the input terminal to receive the input signal, a first electrode of the nineteenth switch transistor is connected to the second voltage terminal to receive the second voltage, and a second electrode of the nineteenth switch transistor is connected to the first node; and a gate electrode of the twentieth switch transistor is connected to the first output terminal to receive the first output signal, a first electrode of the twentieth switch transistor is connected to the sixth clock signal terminal to receive the sixth clock signal, and a second electrode of the twentieth switch transistor is connected to the third node.

16. A gate driving circuit, comprising a plurality of shift register units, which are cascaded, according to claim 1.

17. The gate driving circuit according to claim 16, wherein except for a first shift register unit, an input terminal of each of other shift register units is connected to a first output terminal of a previous shift register unit.

18. A display device, comprising the gate driving circuit according to claim 16.

19. The display device according to claim 18, further comprising a plurality of gate lines, wherein a second output terminal of each shift register unit is connected to at least one gate line of the plurality of gate lines.

20. A method for driving the shift register unit according to claim 1, comprising: a maintaining phase,
wherein, in the maintaining phase, the first clock signal and the second clock signal are input alternately, and the level of the first noise reduction control node is adjusted through the second noise reduction control circuit, so as to turn on the noise reduction circuit to allow the noise reduction circuit to perform noise reduction on the second output terminal.

* * * * *